US011251348B2

United States Patent
Place et al.

(10) Patent No.: US 11,251,348 B2
(45) Date of Patent: Feb. 15, 2022

(54) MULTI-SEGMENT MONOLITHIC LED CHIP

(71) Applicant: CREELED, INC., Durham, NC (US)

(72) Inventors: Thomas Place, Franklinton, NC (US); Kevin Ward Haberern, Cary, NC (US)

(73) Assignee: CREELED, INC., Durham, NC (US)

( * ) Notice: Subject to any disclaimer, the term of this patent is extended or adjusted under 35 U.S.C. 154(b) by 65 days.

(21) Appl. No.: 14/691,314

(22) Filed: Apr. 20, 2015

(65) Prior Publication Data

US 2015/0228876 A1  Aug. 13, 2015

Related U.S. Application Data

(63) Continuation-in-part of application No. 13/801,743, filed on Mar. 13, 2013, now Pat. No. 9,666,764, and
(Continued)

(51) Int. Cl.
*H01L 33/62* (2010.01)
*H01L 33/08* (2010.01)
(Continued)

(52) U.S. Cl.
CPC ........... *H01L 33/62* (2013.01); *H01L 27/153* (2013.01); *H01L 33/08* (2013.01); *H01L 24/05* (2013.01);
(Continued)

(58) Field of Classification Search
CPC . H01L 27/153; H01L 33/08; H01L 21/76898; H01L 23/481; H01L 2924/12041; H01L 33/62
See application file for complete search history.

(56) References Cited

U.S. PATENT DOCUMENTS

| 5,955,747 A * | 9/1999 | Ogihara | H01L 27/153 |
| | | | 257/88 |
| 8,716,724 B2 | 5/2014 | von Malm et al. | |

(Continued)

FOREIGN PATENT DOCUMENTS

| EP | 2320483 A1 | 5/2011 |
| JP | 5657563 B2 | 1/2015 |
| WO | 2013021519 A1 | 2/2013 |

OTHER PUBLICATIONS

Final Office Action for U.S. Appl. No. 15/647,823, dated Jun. 11, 2018, 6 pages.
(Continued)

*Primary Examiner* — Matthew C Landau
*Assistant Examiner* — Mark Hatzilambrou
(74) *Attorney, Agent, or Firm* — Withrow & Terranova, P.L.L.C.; Vincent K. Gustafson

(57) ABSTRACT

Described herein are LED chips comprising pluralities of active regions on the same submount. These active regions are individually addressable, such that beam output from the LEDs can be controlled simply by selectively activating the desired active region in the plurality without resorting to incorporation of advanced optics and reflectors comprising complex moving parts. In some embodiments, one or more active regions can surround one or more other active regions. In some embodiments, the various active regions are individually addressable by virtue of each active region comprising its own anode and sharing a common cathode. In some embodiments, the various active regions are individually addressable by virtue of each active region comprising its own cathode and sharing a common anode. In some embodiments, each active region comprises its own anode and its own cathode.

17 Claims, 19 Drawing Sheets

Related U.S. Application Data a continuation-in-part of application No. 13/608,397, filed on Sep. 10, 2012, now Pat. No. 9,653,643, which is a continuation-in-part of application No. 14/050,001, filed on Oct. 9, 2013, now Pat. No. 9,728,676, which is a continuation-in-part of application No. 13/168,689, filed on Jun. 24, 2011, now Pat. No. 8,686,429.

(60) Provisional application No. 61/727,524, filed on Nov. 16, 2012, provisional application No. 61/621,746, filed on Apr. 9, 2012.

(51) Int. Cl.
| | | |
|---|---|---|
| *H01L 27/15* | (2006.01) | |
| *H01L 33/64* | (2010.01) | |
| *H01L 33/00* | (2010.01) | |
| *H01L 23/00* | (2006.01) | |

(52) U.S. Cl.
CPC .......... *H01L 24/06* (2013.01); *H01L 33/0093* (2020.05); *H01L 33/0095* (2013.01); *H01L 33/64* (2013.01); *H01L 2224/02379* (2013.01); *H01L 2224/02381* (2013.01); *H01L 2224/04042* (2013.01); *H01L 2224/05569* (2013.01); *H01L 2224/0603* (2013.01); *H01L 2224/94* (2013.01); *H01L 2924/01322* (2013.01); *H01L 2924/12041* (2013.01)

(56) References Cited

U.S. PATENT DOCUMENTS

| | | | |
|---|---|---|---|
| 8,963,121 B2 | 2/2015 | Odnoblyudov et al. | |
| 9,048,368 B2 | 6/2015 | Jeong | |
| 9,142,725 B1 | 9/2015 | Suzuki | |
| 9,166,108 B2 | 10/2015 | Unosawa | |
| 9,172,021 B2 | 10/2015 | Sugizaki et al. | |
| 9,231,037 B2 | 1/2016 | Shimayama | |
| 9,324,765 B2 | 4/2016 | An | |
| 9,373,756 B2 | 6/2016 | Lee et al. | |
| 9,653,643 B2 | 5/2017 | Bergmann et al. | |
| 9,666,764 B2 | 5/2017 | Bergmann et al. | |
| 2008/0211416 A1* | 9/2008 | Negley | H01L 27/15 315/193 |
| 2010/0120183 A1* | 5/2010 | Kim | H01L 33/0079 438/29 |
| 2010/0144118 A1* | 6/2010 | Yang | H01L 21/76898 438/459 |
| 2010/0155746 A1* | 6/2010 | Ibbetson | H01L 25/0753 257/88 |
| 2010/0328936 A1* | 12/2010 | Pance | H01L 25/0753 362/231 |
| 2011/0049537 A1* | 3/2011 | Lee | H01L 25/0753 257/88 |
| 2011/0084294 A1 | 4/2011 | Yao | |
| 2012/0032192 A1* | 2/2012 | Shen | H01L 27/153 257/84 |
| 2012/0074441 A1 | 3/2012 | Seo et al. | |
| 2014/0070245 A1* | 3/2014 | Haberern | H01L 33/08 257/93 |

OTHER PUBLICATIONS

Notice of Allowance for U.S. Appl. No. 15/647,823, dated Jul. 26, 2018, 8 pages.
Non-Final Office Action for U.S. Appl. No. 15/647,823, dated Feb. 12, 2018, 5 pages.

* cited by examiner

MULTI-SEGMENT MONOLITHIC LED CHIP

CROSS REFERENCE TO RELATED APPLICATIONS

This application is a continuation in part of, and claims the benefit of, U.S. patent application Ser. No. 13/801,743 to Michael John Bergmann, et al., entitled WAFER LEVEL PACKAGING OF MULTIPLE LIGHT EMITTING DIODES (LEDS) ON A SINGLE CARRIER DIE, filed on Mar. 13, 2013, issued as U.S. Pat. No. 9,666,764, which claims priority from: U.S. Provisional Application Ser. No. 61/727,524, filed on Nov. 16, 2012, U.S. Provisional Application Ser. No. 61/621,746, filed on Apr. 9, 2012, and is a continuation in part of Ser. No. 13/608,397, filed on Sep. 10, 2012, issued as U.S. Pat. No. 9,653,643, all of which are hereby incorporated herein in their entirety by reference. This application is also a continuation in part of and claims the benefit of U.S. patent application Ser. No. 14/050,001 to Kevin W. Haberern, et al., entitled HIGH VOLTAGE MONOLITHIC LED CHIP, filed on Oct. 9, 2013, issued as U.S. Pat. No. 9,728,676, which is a continuation in part of Ser. No. 13/168,689, filed on Jun. 24, 2011, now issued as U.S. Pat. No. 8,686,429, both of which are hereby incorporated herein in their entirety by reference.

BACKGROUND

Field of the Invention

Described herein are devices relating generally to light emitting diode (LED) chips, and specifically LED chips comprising multiple active regions.

Description of the Related Art

LED-based light emitting devices are increasingly being used in lighting/illumination applications, with one ultimate goal being a replacement for the ubiquitous incandescent light bulb. Semiconductor LEDs are widely known solid-state lighting elements that are capable of generating light upon application of voltage thereto. LEDs generally comprise a diode region having first and second opposing faces, and including therein an n-type doped layer, a p-type doped layer and a p-n junction active region. An anode contact ohmically contacts the p-type layer and a cathode contact ohmically contacts the n-type layer. When a bias is applied across the doped layers, holes and electrons are injected into the active region where they recombine to generate light. Light is produced in the active region and emitted from one or more emission surfaces of the LED.

The diode region may be epitaxially formed on a substrate, such as a sapphire, silicon, silicon carbide, gallium arsenide, gallium nitride, etc., growth substrate, but such a substrate can be later removed and the completed device may not include a substrate. The diode region may be fabricated, for example, from silicon carbide, gallium nitride, gallium phosphide, aluminum nitride, indium gallium nitride, aluminum gallium nitride, aluminum indium gallium phosphide and/or gallium arsenide-based materials and/or from organic semiconductor-based materials.

An example of a conventional LED structure as discussed above is shown in FIG. 1, which illustrates an example LED chip 10, comprising a diode region 11, which comprises an n-type layer 12, a p-type layer 14, and an active region 16 between the two layers. The diode region 11 is on a submount 18. The submount 18 is typically a substrate as discussed above and can be the growth substrate upon which the diode region is epitaxially formed, or in the case of flip-chip embodiments, can be the carrier substrate to which the diode region is transferred from the growth substrate. FIG. 1 also shows a cathode contact 20 in the form of a bond pad contacting the n-type layer 12 and an anode contact 22 contacting the p-type layer 14, for example via a conductive substrate 18. While the conventional LED example of FIG. 1 shows the n-type layer 12 as the topmost layer of the diode region 11 and the p-type layer 14 as the bottommost layer of the diode region, many conventional LEDs have a structure with the p-type layer 14 as the topmost layer of the diode region 11 and the n-type layer 12 as the bottommost.

Most typical LED chips have a single active region, although some LED packages comprise a plurality of active regions in the form of multiple junctions or sub-LEDs, such as those disclosed in U.S. Pat. No. 7,985,970, and U.S. Patent Pub. No. 2010/0252840 (both assigned to Cree Inc. and hereby incorporated herein in their entirety by reference).

One problem with current LED technology is that each physical LED chip is limited to being controlled in series for the entire emission region, resulting in all emission regions in a multiple-junction (high-voltage) device being controlled together. Since multiple active regions on the same chip are not independently controlled, in order to vary emission to adjust the emission beam angle or achieve a particular desired emission pattern for the LED chip, complex structures, such as moving mirror or reflector structures, must be incorporated with the device. This increases the cost of manufacturing lighting devices and increases the number of additional components in the device, decreasing efficiency and increasing the chance of device malfunction.

SUMMARY

Described herein are LED chips comprising pluralities of active regions on the same submount that are individually addressable, such that at least two active regions in the plurality of active regions can be activated independently from one another, allowing for adjustment of beam output profiles though selective activation of the various active regions.

In some embodiments, one or more of the active regions in the plurality surround other active regions in the plurality. In some embodiments, the active regions are configured adjacent to each other in successive order. In some embodiments, the multiple active regions share a common cathode contact and each have individual anode contacts. In some embodiments, the multiple active regions share a common anode contact and each have individual cathode contacts. In some embodiments, the multiple active regions each comprise their own separate anode and cathode contacts.

In one embodiment, an LED chip comprises a submount, a plurality of active regions on the submount and connection elements in electrical contact with the plurality of active regions. The connection elements are configured such that at least one active region in the plurality can receive an electrical signal independent from other active regions in the plurality.

In another embodiment, an LED chip comprises a submount, a plurality of active regions on the submount, with at least one of the active regions in the plurality surrounding another of the active regions in the plurality, and connection elements in electrical contact with the plurality of active regions. The connection elements are configured such that at least one active region in the plurality can receive an electrical signal independent from other active regions in the plurality.

In yet another embodiment, an LED chip comprises a submount, a plurality of active regions on the submount and adjacent to one another in successive order and connection elements in electrical contact with the plurality of active regions. The connection elements are configured such that at least one active region in the plurality can receive an electrical signal independent from other active regions in the plurality.

In still another embodiment, a light emitting device comprises an LED chip and a reflector. The LED chip comprises a submount, a plurality of active regions on the submount and connection elements in electrical contact with the plurality of active regions. The connection elements are configured such that each active region in the plurality can receive an electrical signal independent from other active regions in said plurality.

These and other further features and advantages of the invention would be apparent to those skilled in the art from the following detailed description, taken together with the accompanying drawings, wherein like numerals designate corresponding parts in the figures, in which:

DETAILED DESCRIPTION

Figure 1:
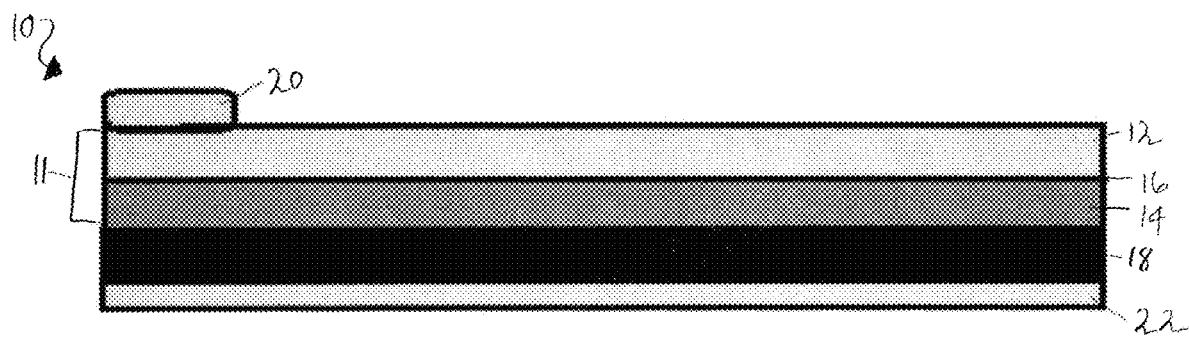
FIG. 1 is front sectional view of a prior art LED chip in contemporary use.

The present disclosure will now set forth detailed descriptions of various embodiments. These embodiments set forth devices pertaining to light emitting devices, such as various LED chips and LED devices. Embodiments incorporating features of the present invention allow for the efficient customization of LED chip beam output through the selective activation of multiple active regions. This allows for improved customization and greater variable beam output because of the ability to independently activate the multiple active regions, all while utilizing a single LED chip without the necessity of incorporating complicated moving parts, including various reflector and optic components.

Devices incorporating features of the present invention include LED chips comprising pluralities of separate active regions that are individually addressable on the same submount. In some embodiments, the diode region of an LED is etched to define two or more active regions that are individually contacted. In some embodiments, the multiple active regions are individually contacted through each comprising their own cathode contact to the n-type layer of the active region, where the multiple active regions share an anode contact. In some embodiments, the multiple active regions share a cathode contact and are individually contacted by their own anode contacts. In some embodiments, the multiple active regions each comprise their own individual anode and cathode contacts.

In some embodiments, one or more of the individually addressable active regions surround one or more other active regions. This allows for efficient control of beam output. By activating only the surrounding outer active region, the beam profile can be wider. By activating only the inner surrounded active region, the beam emission profile can be more narrow. In some embodiments, the multiple active regions are adjacent to one another and are aligned in successive order. This allows for precise control over the various regions of the LED chip and is particularly useful when the chip is installed in a light-emitting device, such that different portions of the chip can interact with different portions of the device, for example, in embodiments wherein different independently addressable active regions are aligned such that they can emit light toward a particular reflective surface or lens, while other active regions are aligned with a different structure to provide specific beam output profiles. In some embodiments, the multiple active regions are not aligned or surrounding another active region, for example, they can be divided into quadrants.

In some embodiments, one or more of the individually addressable active regions in an LED chip can be driven by a different current than other active regions in the chip. This allows for further customization of light output such as beam shape, intensity and beam emission profile.

Throughout this description, the preferred embodiment and examples illustrated should be considered as exemplars, rather than as limitations on the present invention. As used herein, the term "invention," "device," "present invention," or "present device" refers to any one of the embodiments of the invention described herein, and any equivalents. Furthermore, reference to various feature(s) of the "invention," "device," "present invention," or "present device" throughout this document does not mean that all claimed embodiments or methods must include the referenced feature(s).

It is also understood that when an element or feature is referred to as being "on" or "adjacent" to another element or feature, it can be directly on or adjacent the other element or feature or intervening elements or features may also be present. It is also understood that when an element is referred to as being "attached," "connected" or "coupled" to another element, it can be directly attached, connected or coupled to the other element or intervening elements may be present. In contrast, when an element is referred to as being "directly attached," "directly connected" or "directly coupled" to another element, there are no intervening elements present.

Relative terms, such as "outer," "above," "lower," "below," "horizontal," "vertical" and similar terms, may be used herein to describe a relationship of one feature to another. It is understood that these terms are intended to encompass different orientations in addition to the orientation depicted in the figures.

Although the terms first, second, etc. may be used herein to describe various elements or components, these elements or components should not be limited by these terms. These terms are only used to distinguish one element or component from another element or component. Thus, a first element or component discussed below could be termed a second element or component without departing from the teachings of the present invention. As used herein, the term "and/or" includes any and all combinations of one or more of the associated list items.

The terminology used herein is for describing particular embodiments only and is not intended to be limiting of the invention. As used herein, the singular forms "a," "an," and "the" are intended to include the plural forms as well, unless the context clearly indicates otherwise. It will be further understood that the terms "comprises," "comprising," when used herein, specify the presence of stated features, integers, steps, operations, elements, and/or components, but do not preclude the presence or addition of one or more other features, integers, steps, operations, elements, components, and/or groups thereof.

Embodiments of the invention are described herein with reference to different views and illustrations that are schematic illustrations of idealized embodiments of the invention. As such, variations from the shapes of the illustrations as a result, for example, of manufacturing techniques and/or tolerances are expected. Embodiments of the invention should not be construed as limited to the particular shapes of the regions illustrated herein, but are to include deviations in shapes that result, for example, from manufacturing.

It is understood that when a first element is referred to as being "between," "sandwiched," or "sandwiched between," two or more other elements, the first element can be directly between the two or more other elements or intervening elements may also be present between the two or more other elements. For example, if a first layer is "between" or "sandwiched between" a second and third layer, the first layer can be directly between the second and third layers with no intervening elements or the first layer can be adjacent to one or more additional layers with the first layer and these additional layers all between the second and third layers.

It is noted that the terms "layer" and "layers" are used interchangeably throughout this application. A person of ordinary skill in the art will understand that a single "layer" of material may actually comprise several individual layers of material. Likewise, several "layers" of material may be considered functionally as a single layer. In other words, the term "layer" does not denote a homogenous layer of material. A single "layer" may contain various material concentrations and compositions that are localized in sub-layers. These sub-layers may be formed in a single formation step or in multiple steps. Unless specifically stated otherwise, it is not intended to limit the scope of the invention as embodied in the claims by describing an element as comprising a "layer" or "layers" of material.

The basic structure of light emitting diodes is generally known in the art and is therefore only briefly discussed herein. The diode region can comprise two oppositely doped semiconductor layers with an active region therebetween. An anode contact ohmically contacts the p-type doped layer and a cathode contact ohmically contacts the doped layer. When a bias is applied across the doped layers, holes and electrons are injected into the active region where they recombine to generate light. One suitable semiconductor material to utilize for the diode region is GaN, although any semiconductor material known in the art for use in the manufacture of LEDs are within the scope of this disclosure. Some example semiconductor materials include, but not limited to, materials comprising: Gallium arsenide (GaAs), aluminum gallium arsenide (AlGaAs), gallium arsenide phosphide (GaAsP), aluminum gallium indium phosphide (AlGaInP), gallium(III) phosphide (GaP), gallium arsenide phosphide (GaAsP), aluminum gallium phosphide (AlGaP), indium gallium nitride (InGaN), aluminum nitride (AlN), aluminum gallium nitride (AlGaN), aluminum gallium indium nitride (AlGaInN), and combinations thereof.

Figure 2:
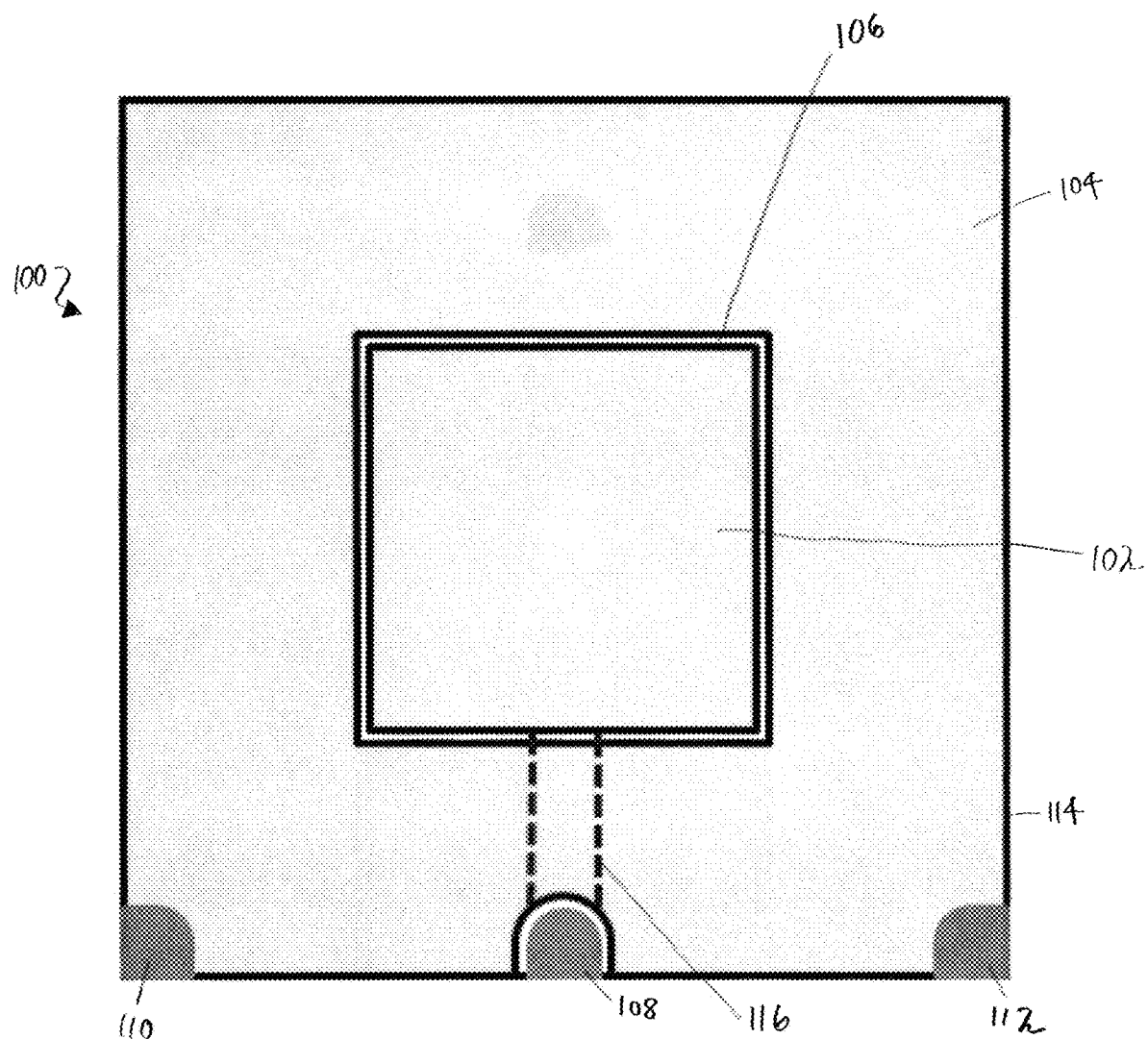
FIG. 2 is top plan view of an embodiment of an LED chip incorporating features of the present invention.

An LED chip 100 incorporating features of the present invention is shown in FIG. 2. The LED chip 100 is shown in a top plan view, showing the topmost semiconductor layer of the diode region of the chip, which in the embodiment shown is an n-type layer, although it is understood that in some embodiments, the topmost semiconductor layer in the diode region is a p-type layer. It is further understood that LEDs incorporating features of the present invention can further comprise various additional layers, such as reflector layers or current spreading layers in addition to the semiconductor layers. The LED chip 100 comprises a first active region 102, a second active region 104, a separation region 106, a first cathode contact 108, which contacts the n-type layer of the first active region 102, a second cathode contact 110, which contacts the n-type layer of the second active region 104, and a third cathode contact 112, which also contacts the n-type layer of the second active region 104.

The semiconductor layers are on a common submount 114, forming a single LED chip device. The submount 114 can be any suitable mounting surface for the semiconductor layers, for example, any suitable LED substrate known in the art. Some example substrates include sapphire, silicon or silicon carbide substrates. Such a substrate can be a substrate upon which the semiconductor layers are grown (a growth substrate) or a substrate to which the semiconductor layers are later transferred, for example, as with flip-chip embodiments (a carrier substrate).

A common anode contact, which is not shown due to being positioned on the bottom surface of the LED chip 100 provides access for electrical contact to the p-type semiconductor layers of the first and second active regions 102, 104. In some embodiments, the submount 114 is a conductive substrate and the anode contact contacts the p-type layer through the conductive substrate. It is understood that in embodiments wherein the topmost semiconductor layer is a p-type layer, first, second and third n-type contacts can instead be replaced by anode contacts and that a common cathode contact can electrically contact bottommost n-type semiconductors layer of the LED chip 100.

The first active region 102 and the second active region 104 are separated by the separation region 106. The purpose of separation region 106 is to separate the first and second active regions 102, 104 from each other, either through electrical isolation or physical separation, and sufficiently isolate them so electrical signals from the first cathode contact 108 to the first active region 102 will not provide an electrical signal to the second active region 104 and so that the second and third cathode contacts 110, 112 to the second active region 104 will not provide an electrical signal to the first active region 102.

The separation region 106 can comprise any known configuration or method sufficient to separate semiconductor layers from one another that is known in the art. In some embodiments, separation region 106 is formed by etching the semiconductor layers to a degree sufficient to separate the first active region 102 from the second active region 104. In some embodiments, such as the embodiment shown in FIG. 2, the separation region 106 is etched to the level of the submount 114 or the underlying anode contact. In some embodiments, a passivation layer is deposited on the separation region 106 after etching. Further examples of etching used to define multiple semiconductor regions can be found in US Patent Publication No. 2013/0264592, assigned to Cree, Inc., which is incorporated herein in its entirety by reference.

One advantage of utilizing etching as the method of forming the separation region 106 is that etching of a diode region of a chip can provide a sufficiently narrow separation region 106, such that there are smaller gaps in die placement than there would be if one were to try to achieve the multiple active region effect by simply placing two separate LED die close together. This allows for creation of more uniform emission and the creation of certain beam patterns not possible in embodiments utilizing multiple LED die.

The first cathode contact 108, the second cathode contact 110 and the third cathode contact 112 can comprise any form of electrical connection elements known in the art, for example, bond pads, which can form electrical connection through the use of wire bonds to outside electrical sources and internal and/or integral electrical connection elements, for example, conductive busses and vias. In the embodiment shown in FIG. 2, the first cathode contact 108 comprises an internal or integrated connection 116 to the first active region 102, with the internal connection running integral to the layers of the submount 114 and running below, and being electrically isolated from, active region 104.

The internal connection 116 is electrically isolated from the second active region 104, such that providing electricity to the internal connection 116 through the first cathode contact 108 will only provide an n-type electrical connection to the first active region 102. The second and third cathode contacts 110, 112 comprise bond pads, which can be connected to an outside electrical source via wire bonds.

One advantage of utilizing an internal or integral connection 116 to the first active region 102 is that wire bond connections to the more internally-positioned first active region are not necessary. While wire-bonding the more outer-positioned second and third cathode contacts 110, 112 provides no significant disadvantage, wire-bonding a bond pad positioned in the center of the LED chip 100 where the first active region 102 is located can potentially result in the wire bond blocking some of the emitted light over the top center region. This results in inefficient light extraction and can also cause a disorienting sensation for viewers.

In some embodiments, internal connection element 116 comprises one or more internal interconnect elements, which comprise an electrically conductive element surrounded by passivation material. Such internal interconnect elements can be formed internal to the submount during device fabrication. Further examples of such internal interconnection elements can be found in US Patent Publication No. 2014/0070245, assigned to Cree, Inc., which is incorporated herein in its entirety by reference.

One embodiment of a monolithic LED chip comprises a plurality of active regions on a submount. Integral electrically conductive interconnect elements are included in electrical contact with the active regions and electrically connecting at least some of the active region in series. One or more integral insulating layers are also included surrounding at least a portion of the interconnect elements and isolating the portion from other elements of the LED chip.

The electrical interconnects can be arranged so that at least a portion is buried or surrounded in electrical insulating material. The submount can also have a barrier layer that does not extend beyond the edge of or wrap around the portions of the mirror layer, with the portion being particularly below the primary emission area of the active regions. This can help minimize the light that might be absorbed during operation, thereby increasing the overall emission efficiency of the active regions.

In certain embodiments, at least a portion of the interconnects are buried in or surrounded by insulating material to electrically isolate them from other features in the LED chip. This structure can then mounted to a separate substrate and bonding layer structure to form monolithic LED chips with serially interconnected active regions.

Because of the separation region 106 and the configuration of the electrical connection elements 108, 110, 112, the first active region 102 and the second active region 104 are individually addressable. This allows for the emission output of the LED chip 100 to be controlled electrically, rather than through the integration of complex moving parts, such as moving lens and reflector structures. By applying power to the first active region 102, for example, through the first cathode contact 108 and the internal connection 116 (thus providing cathode contact through internal connection 116 and anode contact through the submount 114), only the center portion of the LED chip 100 is activated and emitting light, as the cathode contacts 110, 112 to the second active region 104 are not activated. This results in a more narrow beam emission from the LED chip 100. While a single contact 108 and an internal connection 116 are shown as contacting the first active region 102, it is understood that other structures such as bond pads and/or conductive vias can also be utilized. It is further understood that other electrical connections known in the art can be utilized to provide anode and cathode contacts to the first active region 102.

By applying power to the second active region 104, for example, through second and third cathode contacts 110, 112 (thus providing cathode contact through the second and third cathode contacts 110, 112 and anode contact through the submount 114), only the outer portion of the LED chip 100 is activated and emitting light, as the first cathode contact 108 to the first active region 102 is not activated. This results in a wider beam emission from the LED chip 100. This effect can be increased by utilizing the LED chip 100 with further structures, such as various lenses, optics and reflectors.

One advantage of the individually addressable multiple active regions of the LED chip 100, is that these various structures can simply be stationary and do not need to be moveable or otherwise variable to produce variable emission as the beam output can be varied electrically as described. While two bond pads 110, 112 are shown as contacting the second active region 104, it is understood that one or more internal connections, conductive vias, a single bond pad and/or more than two bond pads can be utilized to provide electrical contact to the active region 104. It is further understood that other electrical connections known in the art can be utilized to provide anode and cathode contacts to the second active regions 104.

In the LED chip 100 of FIG. 2, the first active region 102 is surrounded by the second active region 104. The first active region 102 can be partially surrounded, or be substantially or completely surrounded (as shown). In some embodiments, such as those discussed in more detail further below, the first active region 102 is not surrounded by the second active region 104. At least one advantage of having an individually addressable active region surrounded by another individually addressable active region, is that beam emission can be even more tightly controlled, for example, easily widening the beam emission by activating the outer active region and narrowing the beam emission by activing the inner active region as discussed above.

While the first active region 102 and the second active region 104 are shown to be roughly square in shape, it is understood that active regions according to the present disclosure can comprise any number of shapes as needed to obtain a desired beam output profile. Some shapes include any regular or irregular polygon, as well as curved or circular shapes. It is further understood that in embodiments wherein one active region surrounds another active region, the shapes of the various active regions do not need to be identical or even similar. For example, in some embodiments, the inner active region can comprise one shape, such as a triangle or a square, while the surrounding active region can comprise another shape, for example, a circular or elliptical shape. Various examples of differently shaped active regions are also set forth further below in the present disclosure.

Figure 3:
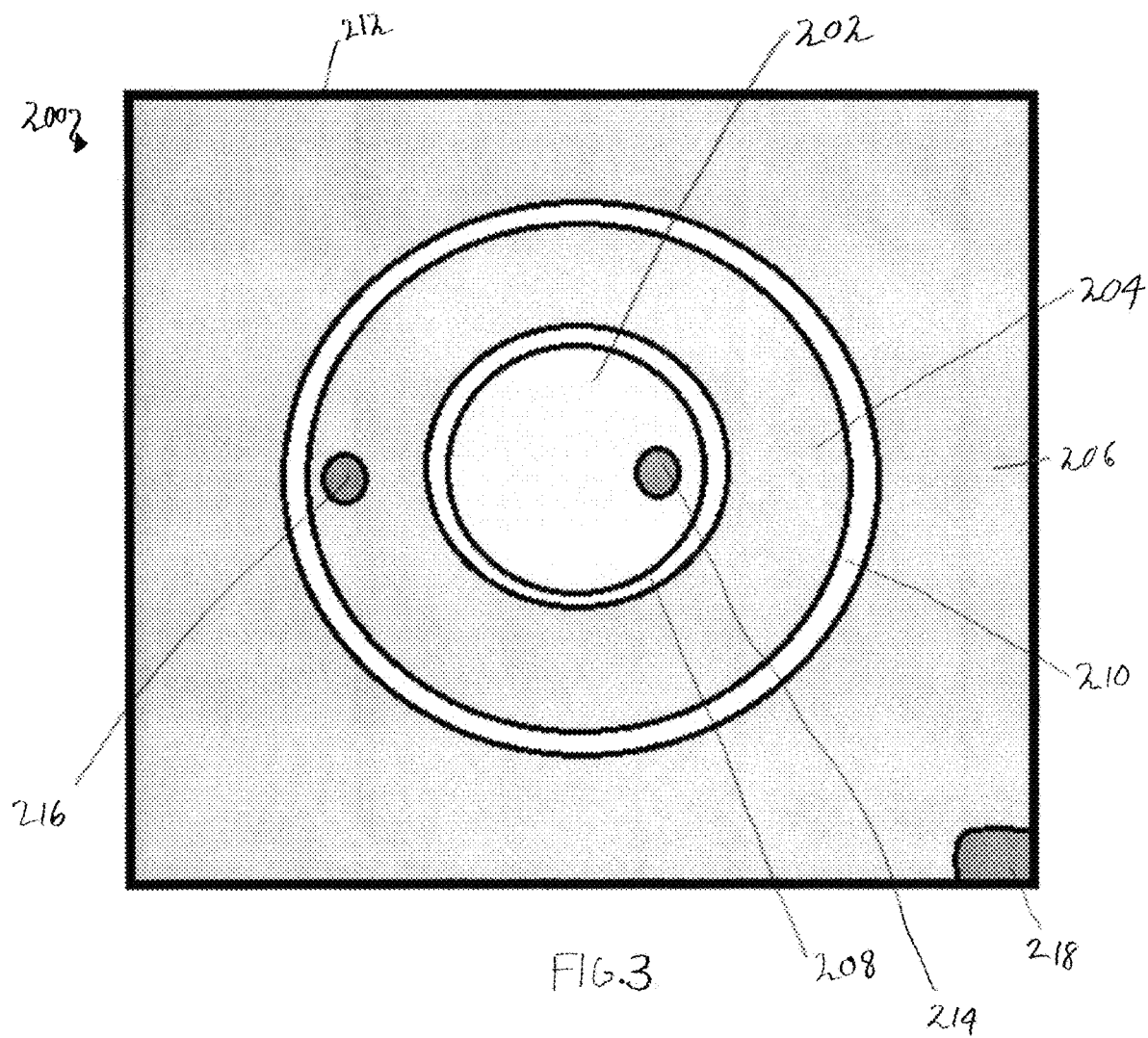
FIG. 3 is top plan view of an embodiment of an LED chip incorporating features of the present invention.

While the embodiment of FIG. 2 above relates to a LED chip having two active regions on a common substrate, it is understood that LEDs incorporating features of the present invention can have one or more further multiple active regions in the plurality of active regions. FIG. 3 shows one example of an LED chip 200, comprising a first active region 202, surrounded by a second active region 204, which is in turn surrounded by a third active region 206.

The first active region 202 and the second active region 204 are separated by a first separation area 208 and the second active region 204 and the third active region 206 are separated by a second separation area 210. Like with FIG. 2 above, the topmost semiconductor layer is an n-type layer, although it is understood, as previously discussed herein, that in some embodiments, a p-type layer is the topmost layer. The semiconductor layers are on a submount 212.

Each of the active regions have electrical connection elements, with a first cathode contact 214 contacting the first active region 202, a second cathode contact 216 contacting the second active region 204 and a third cathode contact 218 contacting the third active region 206. These contacts 214, 216, 218 can be provided with power using wire bonds or any configurations that is known in the art. The anode contact is not shown as it is on the bottom surface of the LED chip 200 as in FIG. 2, for example, connected to a conductive substrate. Although the electrical connection elements 214, 216, 218 are shown in FIG. 2 as being bond pads, it is understood that any electrical connection elements can be utilized, for example, conductive vias though the submount and/or one or more layers, busses or internal interconnects as described above.

The various embodiments of LED chips disclosed herein can comprise multiple active regions of various and differing shapes to produce a desired beam profile. In the LED chip 200 of FIG. 3, the first and second active regions 202, 204 are circular in shape, whereas the third active region 206 is roughly square with a circular inner surface. This shape layout, coupled with the multiple surrounding active region configuration, can potentially provide even greater control over beam emission. By only activating the third active region 206, the periphery of the LED chip 200 is emissive, providing a relatively wide beam output. In contrast, activating the second active region 204 or the first active region 202 will provide a more narrow beam output, with the beam output of the centermost active region (first active region 202) providing the most narrow beam output.

Figure 4:
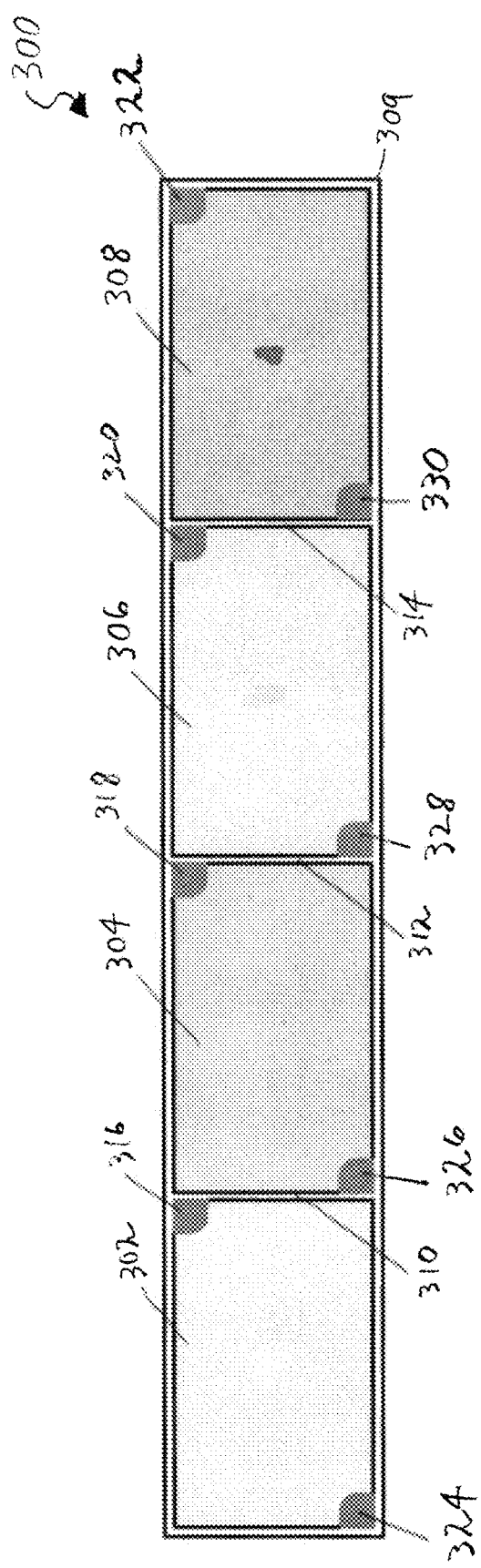
FIG. 4 is top schematic view of an embodiment of an LED chip incorporating features of the present invention.

While the above-described embodiments of FIGS. 2-3 comprise a configuration wherein an active region is surrounded by another active region, other configurations are also possible. In some embodiments, multiple active regions are configured adjacent to each other one after another in successive order. One such configuration is shown in FIG. 4, which shows LED chip 300 comprising four separate active regions 302, 304, 306, 308 on a common submount 309, separated by separation regions 310, 312, 314. The linear configuration of the active regions 302, 304, 306, 308 of the LED chip 300 allows for another different type of beam output control. In some embodiments, the LED chip 300 is used in conjunction with an optic or reflector, for example, in automobile headlight embodiments or flashlight embodiments. In these embodiments, different active regions can line up with different portions of an optic or reflector can be individually activated to produce light that will interact with a particular feature of an optic or reflector to provide a desired beam output.

In addition to the different active region configuration, the LED chip 300 of FIG. 4 differs from the LED chip 200 of FIG. 3 and the LED chip 100 of FIG. 2 in that the active regions 302, 304, 306, 308 of LED chip 300 of FIG. 4 do not share a common anode contact, but instead each individual active region has its own individual anode contacts 316, 318, 320, 322, as well as its own individual cathode contacts 324, 326, 328, 330. In this embodiment, the anode and cathode contacts comprise bond pads in lateral geometry, both being accessible from the top surface of the LED chip 300. This can be achieved, for example, by etching away a portion of the top n-layer such that topside contact to then underlying p-layer can occur or through various methods of forming lateral geometry devices that are known in the art. In some embodiments, the contacts are in vertical geometry such that one of the contacts is accessible from the top surface of the LED chip 300 and the other is accessible from the bottom surface.

Figure 5:
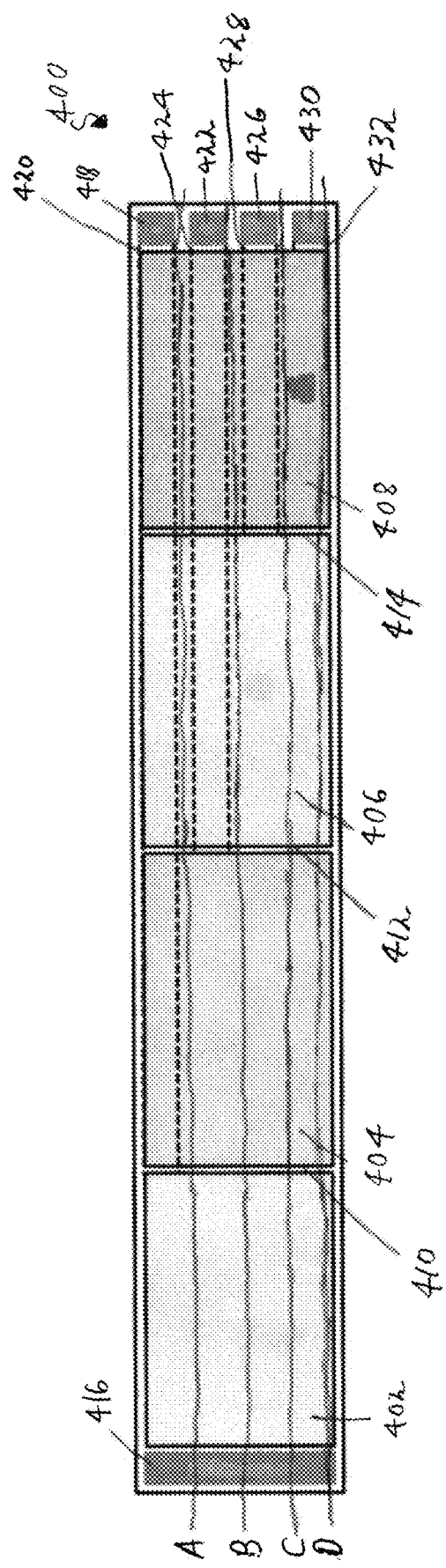
FIG. 5 is top schematic view of an embodiment of an LED chip incorporating features of the present invention.

Another linear adjacent multiple active region LED chip 400 is shown in FIG. 5 which, like in FIG. 4, shows four active regions 402, 404, 406, 408, separated by separation regions 410, 412, 414. Unlike in FIG. 4, the active regions 402, 404, 406, 408 of the LED chip 400 of FIG. 5 share a common cathode contact 416 and each active region comprises individual anode contacts with a first anode contact 418 contacting the first active region 402 with a first anode internal connection 420, a second anode contact 422 contacting the second active region 404 with a second anode internal connection 424, a third anode contact 426 contacting the third active region 406 with a third anode internal connection 428 and a fourth anode contact 430 contacting the fourth active region 408 with a fourth anode internal connection 432. The common cathode contact 416 can be an elongated bond pad as shown, allowing the individual active regions 402, 404, 406, 408 to connect to the cathode contact 416 at different points along its length or any connection structure known in the art. The individual anode contacts 418, 422, 426, 430 can be individualized bond pads allowing each of the active regions 402, 404, 406, 408 to be individually addressable through their anode connection or any connection structure known in the art.

Figure 6:
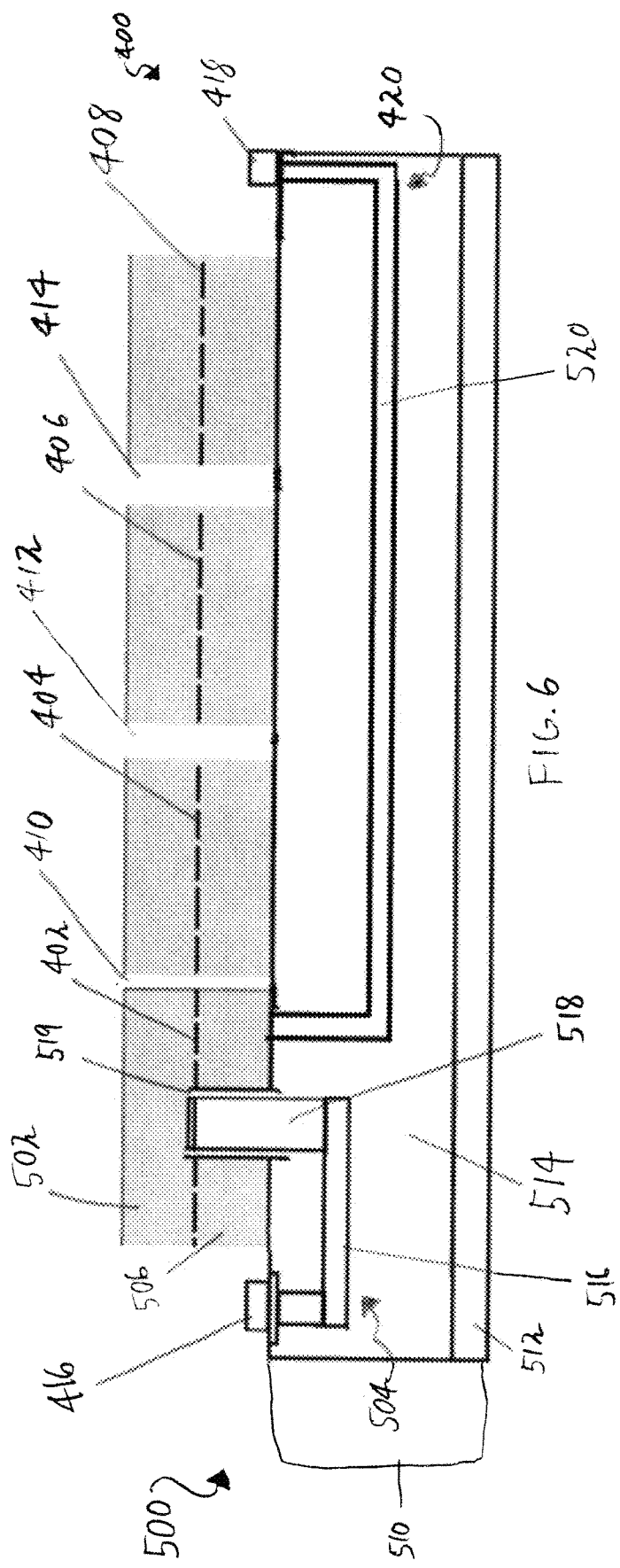
FIG. 6 is a front sectional view of a cross section of the embodiment of the LED chip of FIG. 5.

Four cross section lines A, B, C and D are shown in FIG. 5 corresponding to different depths within the LED chip 400. These cross sections correspond to front sectional views shown in FIGS. 6-9, which illustrate example internal connection configurations that can be utilized with the LED chip 400. FIG. 6 shows a front sectional view 500 corresponding to cross section line A in FIG. 5. The sectional view 500 shows the first, second, third and fourth active regions 402, 404, 406, 408 and the first second and third separation regions 410, 412, 414. FIG. 6 also shows the common cathode contact 416 contacting the n-type layer 502 of the first active region 402 through a first cathode internal connection 504 and the first anode contact 418 contacting the p-type layer 506 of the first active region through the first anode internal connection 420.

The submount 510 comprises a substrate 512, which can be made of any suitable substrate material that is known in the art, such as the materials discussed herein. The submount 510 can further comprise an isolation layer 514, which can comprise many different materials, with the preferred material being an electrically insulating material, such as a dielectric. In some embodiments, the isolation layer 514 comprises oxides, nitrides or oxynitrides of elements Si and Al. In some embodiments, all or a portion of the top surface of the LED chip 400 can be coated with a passivation layer, which can provide additional protection to the LED chip 400 and/or electrical isolation between the individual active regions 402, 404, 406, 408.

The first cathode internal connection 504 can comprise a first conductive interconnect 516 and an n-type via 518, which is isolated from the p-type layer 506 by a passivation layer 519, which can comprise any suitable insulating material, for example, materials similar to the isolation layer 514. The first anode internal connection 420 can comprise a second conductive interconnect 520. The first cathode internal connection 504 and the first anode internal connection 420 can also comprise any internal interconnect configurations that are known in the art. The first cathode internal connection 504 and the first anode internal connection 420 can comprise any electrically conductive material, for example, various metals and/or materials known to be used with interconnect elements known in the art. In some embodiments, these internal connections are formed internally to the submount 510 during device fabrication.

While the LED chip 400 shown in the sectional view 500 of FIG. 6 comprises an n-type layer 502 as the topmost semiconductor layer and an p-type layer 506 as the bottommost semiconductor layer, it is understood by one of ordinary skill in the art that the same principles described herein can be utilized to provide electrical connection to individual active regions in LED chips embodiments wherein the p-type layer is the topmost layer and the n-type layer is the bottommost layer. Furthermore, it is understood that while a basic submount 510 and active region 402, 404, 406, 408 configuration is shown herein, more complex LED chip structures can incorporate features of the present invention. For example, various barrier layer, mirror layer and reflective layer configurations can be utilized with the LED chip. Further examples of various internal interconnect configurations and LED chips and packages utilizing them can be found in US Patent Publication 2014/0070245, which is assigned to Cree, Inc., and which is incorporated herein in its entirety by reference.

Figure 7:
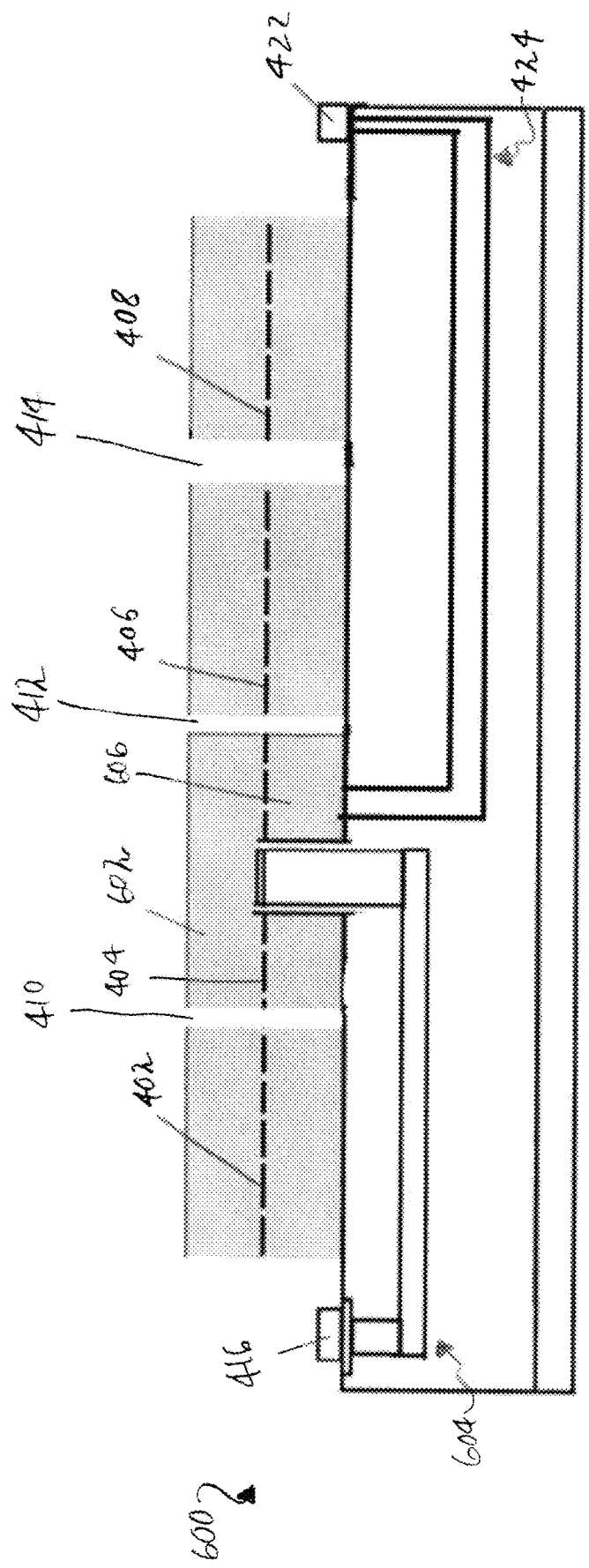
FIG. 7 is a front sectional view of another cross section of the embodiment of the LED chip of FIG. 5.
Figure 8:
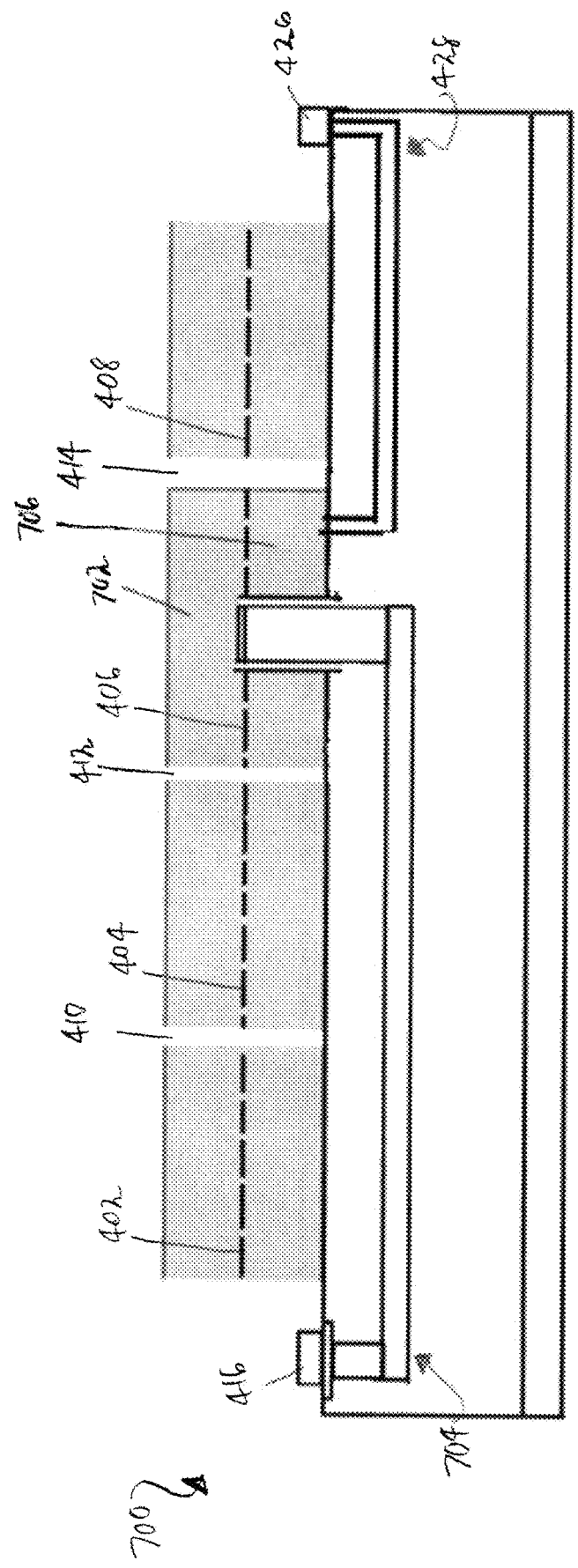
FIG. 8 is a front sectional view of still another cross section of the embodiment of the LED chip of FIG. 5.
Figure 9:
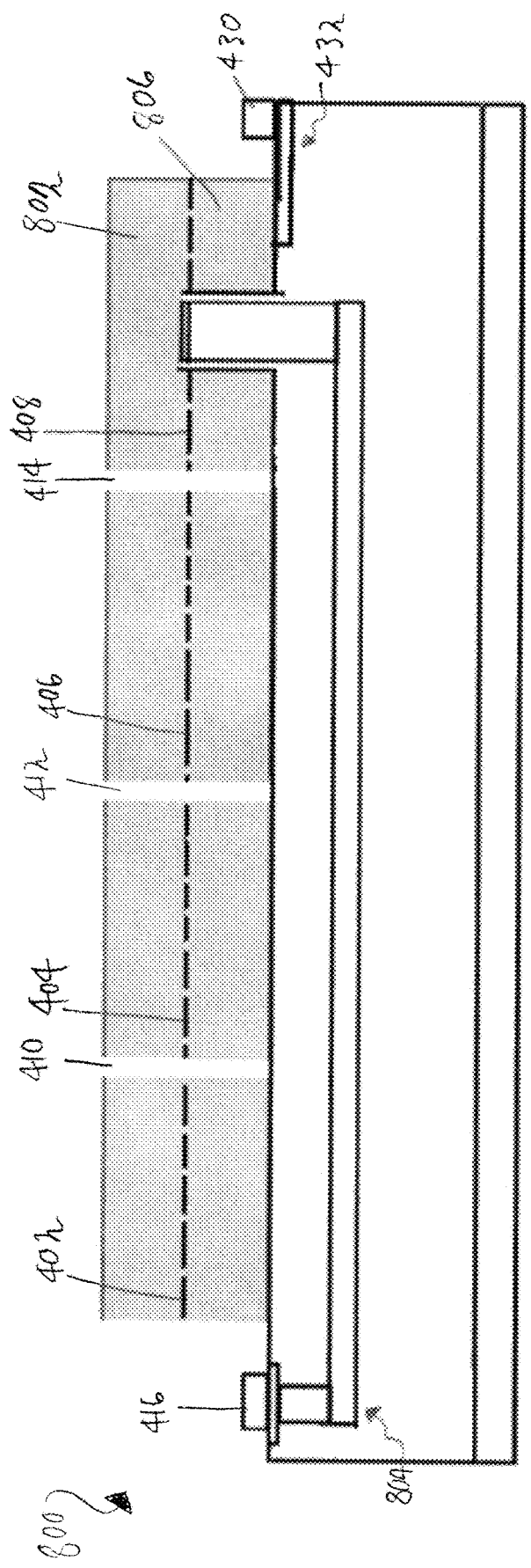
FIG. 9 is a front sectional view of yet another cross section of the embodiment of the LED chip of FIG. 5.

The other cross sections B, C, D of FIG. 5 are shown in FIGS. 7-9. FIG. 7 shows a front sectional view 600 corresponding to cross section line B in FIG. 5. The sectional view 600 shows the first, second, third and fourth active regions 402, 404, 406, 408 and the first second and third separation regions 410, 412, 414. FIG. 7 also shows the common cathode contact 416 contacting the n-type layer 602 of the second active region 404 through a second cathode internal connection 604 and the second anode contact 424 contacting the p-type layer 606 of the second active region through the second anode internal connection 424. While the second active region 404 is connected to the same cathode contact 416 as is the first active region 402, as is shown in FIG. 6, FIG. 7 shows that the second active region 404 is connected to a different anode contact 422 that the first active region 402. Accordingly, an electrical signal applied to the common cathode 416 and the second anode contact 422 will individually address the second active region 404, without addressing the first active region 402.

FIG. 8 shows a front sectional view 700 corresponding to cross section line C in FIG. 5. The sectional view 700 shows the first, second, third and fourth active regions 402, 404, 406, 408 and the first second and third separation regions 410, 412, 414. FIG. 8 also shows the common cathode contact 416 contacting the n-type layer 702 of the third active region 406 through a third cathode internal connection 704 and the third anode contact 426 contacting the p-type layer 706 of the third active region through the third anode internal connection 428. This view 700 shows how the third active region 406 is individually addressable from the first and second active regions 402, 404.

FIG. 9 shows a front sectional view 800 corresponding to cross section line D in FIG. 5. The sectional view 800 shows the first, second, third and fourth active regions 402, 404, 406, 408 and the first second and third separation regions 410, 412, 414. FIG. 9 also shows the common cathode contact 416 contacting the n-type layer 802 of the fourth active region 408 through a fourth cathode internal connection 804 and the fourth anode contact 430 contacting the p-type layer 806 of the fourth active region through the fourth anode internal connection 432. FIGS. 6-9, when taken together, further clarify the relationship between the common cathode contact 416, the individual anode contacts 418, 422, 426, 430 and the individual active regions 402, 404, 406, 408, and show how selective application of an electrical signal results in the individual active regions being separately addressable.

Figure 10:
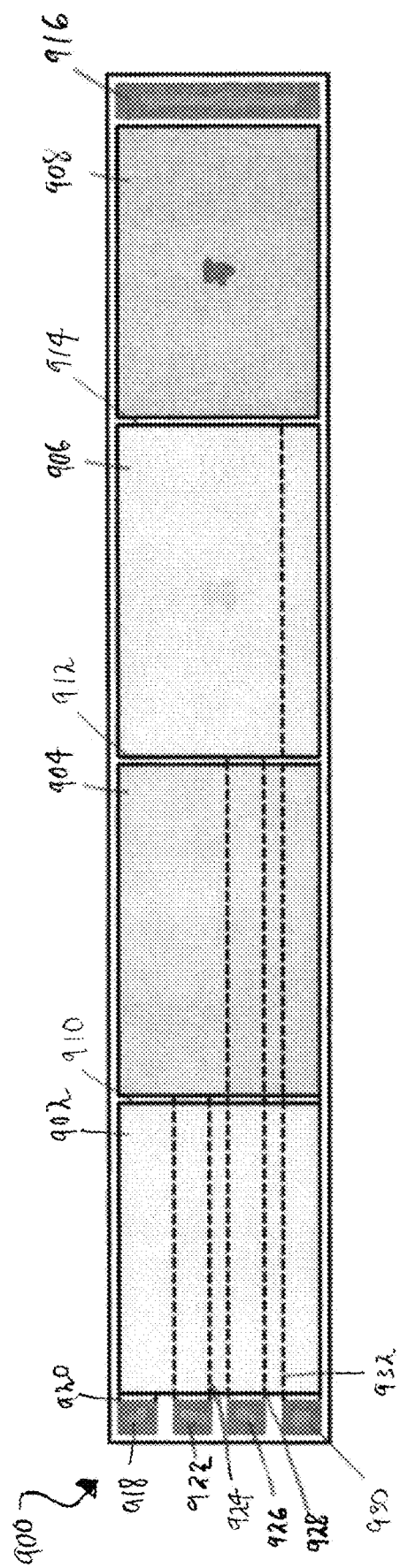
FIG. 10 is a top schematic view of an embodiment of an LED chip incorporating features of the present invention.

Another variant electrical connection element configuration is shown in FIG. 10 which, like in FIG. 5, shows an LED chip 900 comprising four active regions 902, 904, 906, 908, separated by separation regions 910, 912, 914. Unlike in FIG. 5, the active regions 902, 904, 906, 908 of the LED chip 900 of FIG. 10 share a common anode contact 916 and each active region comprises individual cathode contacts with a first cathode contact 918 contacting the first active region 902 with a first internal connection 920, a second cathode contact 922 contacting the second active region 904 with a second internal connection 924, a third cathode contact 926 contacting the third active region 906 with a third internal connection 928 and a fourth cathode contact 930 contacting the fourth active region 908 with a fourth internal connection 932. The common anode contact 916 can include any connection structure known in the art or can be an elongated bond pad like the cathode in FIG. 5, while the individual cathode contacts 918, 922, 926, 930 can be separate bond pads allowing for individualized connection.

Figure 11:
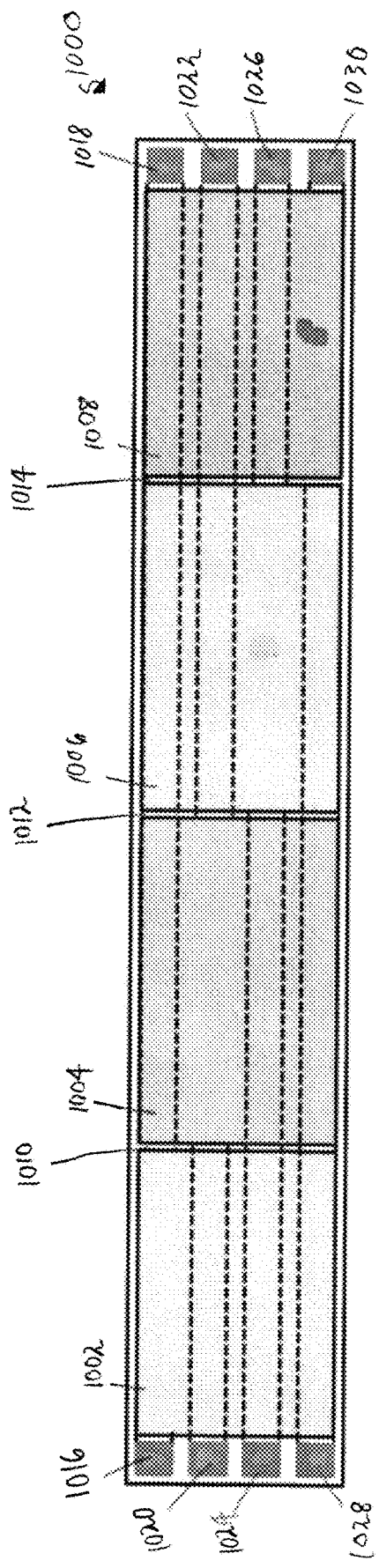
FIG. 11 is a top schematic view of an embodiment of an LED chip incorporating features of the present invention.

Still another variant electrical connection element configuration is shown in FIG. 11, which like in FIGS. 4-10 above shows an LED chip 1000 comprising four adjacent active regions 1002, 1004, 1006, 1008 arranged in linear successive fashion, separated by separation regions 1010, 1012, 1014. Like in FIG. 4, each individual active region 1002, 1004, 1006, 1008 is connected to its own separate individual anode and cathode contact. Unlike in FIG. 4, wherein bond pads alone are utilized, the electrical connection elements in the LED chip 1000 of FIG. 11 utilizes internal connection elements.

Utilizing internal connections, such as those described above, FIG. 11 shows the first active region 1002 being contacted by a first cathode contact 1016 and a first anode contact 1018, the second active region 1004 being contacted by a second cathode contact 1020 and a second anode contact 1022, the third active region 1006 being contacted by a third cathode contact 1024 and a third anode contact 1026, and the fourth active region 1008 being contacted by a fourth cathode contact 1028 and a fourth anode contact 1030. This configuration can be advantageous as it allows for individual connection of one or more active regions to its own anode and cathode contact without utilizing wire bonds to bond pads, which can block some of the emitted light.

Figure 12:
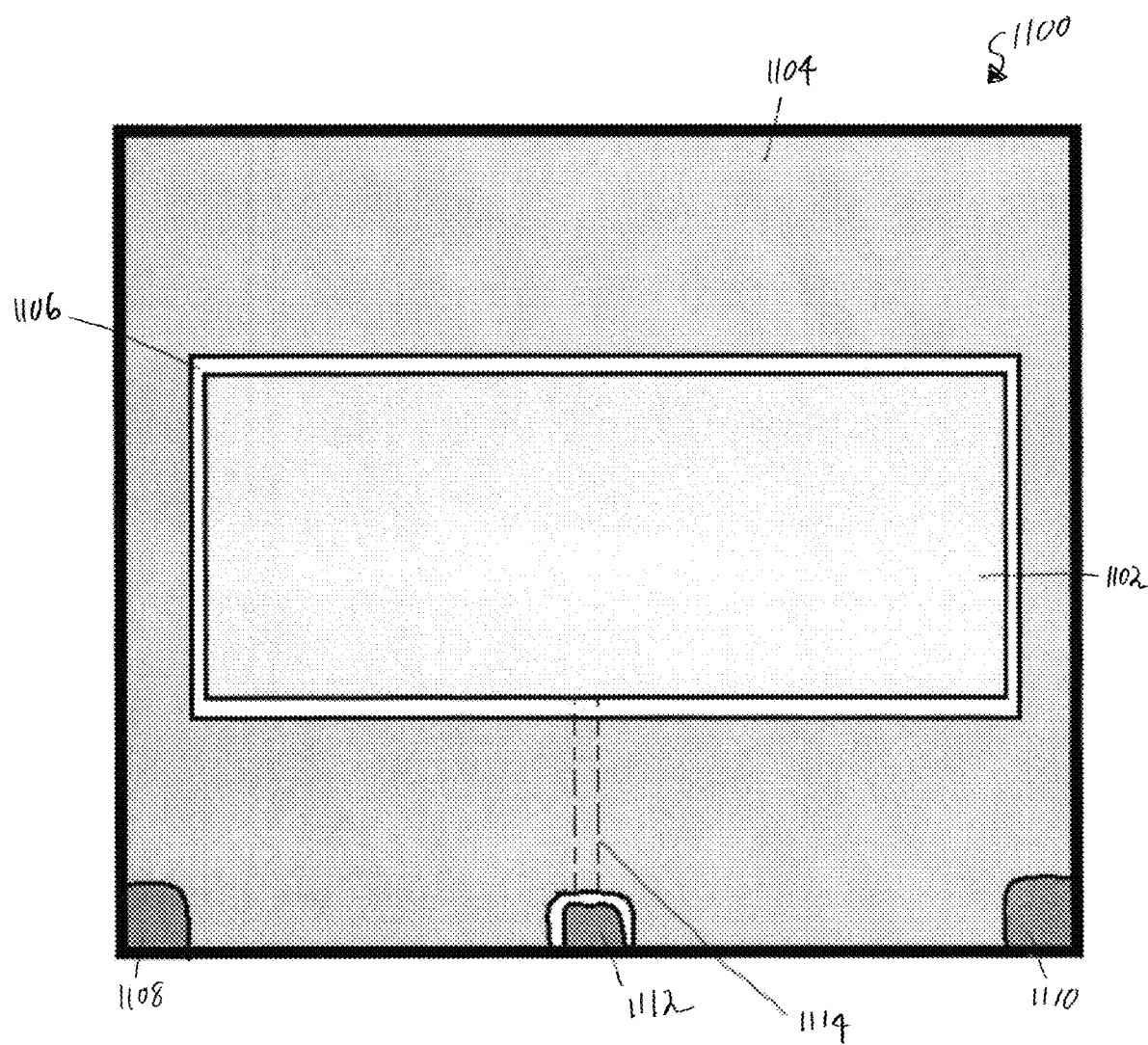
FIG. 12 is a top plan view of an embodiment of an LED chip incorporating features of the present invention.

Additional example active region shapes are shown in FIGS. 12-15, which show configurations similar to those set forth in FIG. 2 above, utilizing a first active region surrounded by a second active region. FIG. 12 shows an LED chip 1100, comprising a first active region 1102 and a second active region 1104 separated by a separation region 1106. First and second cathode bond pads 1108, 1110 are configured to provide electrical contact to the second active region 1104 and a third cathode contact 1112, utilizes an internal connection 1114 to make electrical contact to the surrounded first active region 1102. As with FIG. 2 above, the anode contact is common to both active regions 1102, 1104 and is not shown. Unlike in FIG. 2, the first active region 1102 is rectangular rather than square. This provides a wider lateral beam emission pattern when the first active region 1102 is activated than that of the square first active region 102 of FIG. 2 discussed above.

Figure 13:
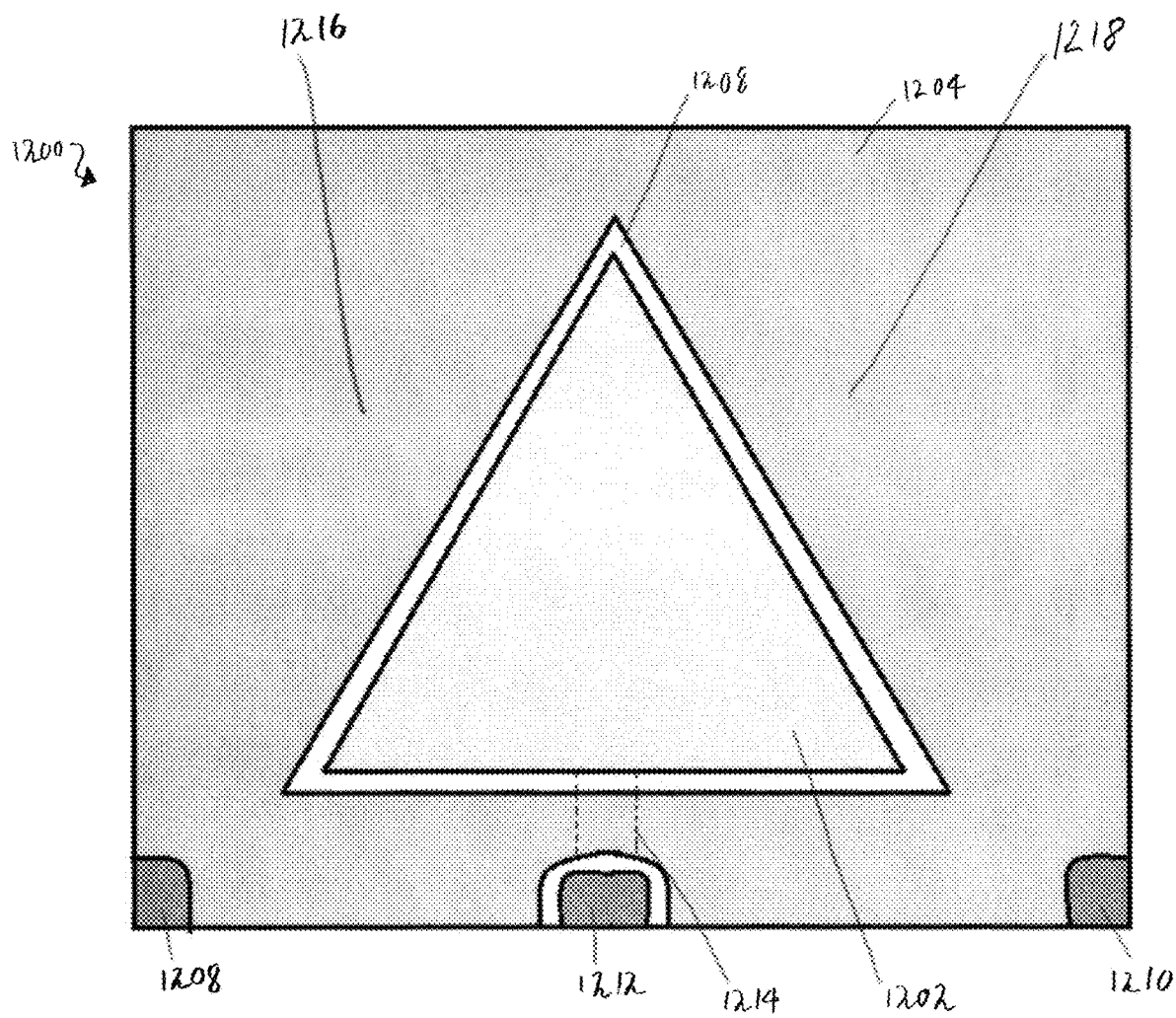
FIG. 13 is a top plan view of an embodiment of an LED chip incorporating features of the present invention.

Another example variant active region shape is set forth in FIG. 13, which shows an LED chip 1200, comprising a first active region 1202 and a second active region 1204 separated by a separation region 1206. First and second cathode bond pads 1208, 1210 are configured to provide electrical contact to the second active region 1204 and a third cathode contact 1212, utilizes an internal connection 1214 to make electrical contact to the surrounded first active region 1202. As with FIG. 2 above, the anode contact is common to both active regions 1202, 1204 and is not shown. Unlike in FIG. 2, the first active region 1202 is triangular rather than square. This provides a narrower beam emission pattern from the upper two corners 1216, 1218 of the LED chip 1200 when the first active region 1202 is activated than that of the square first active region 102 of FIG. 2 discussed above.

Figure 14:
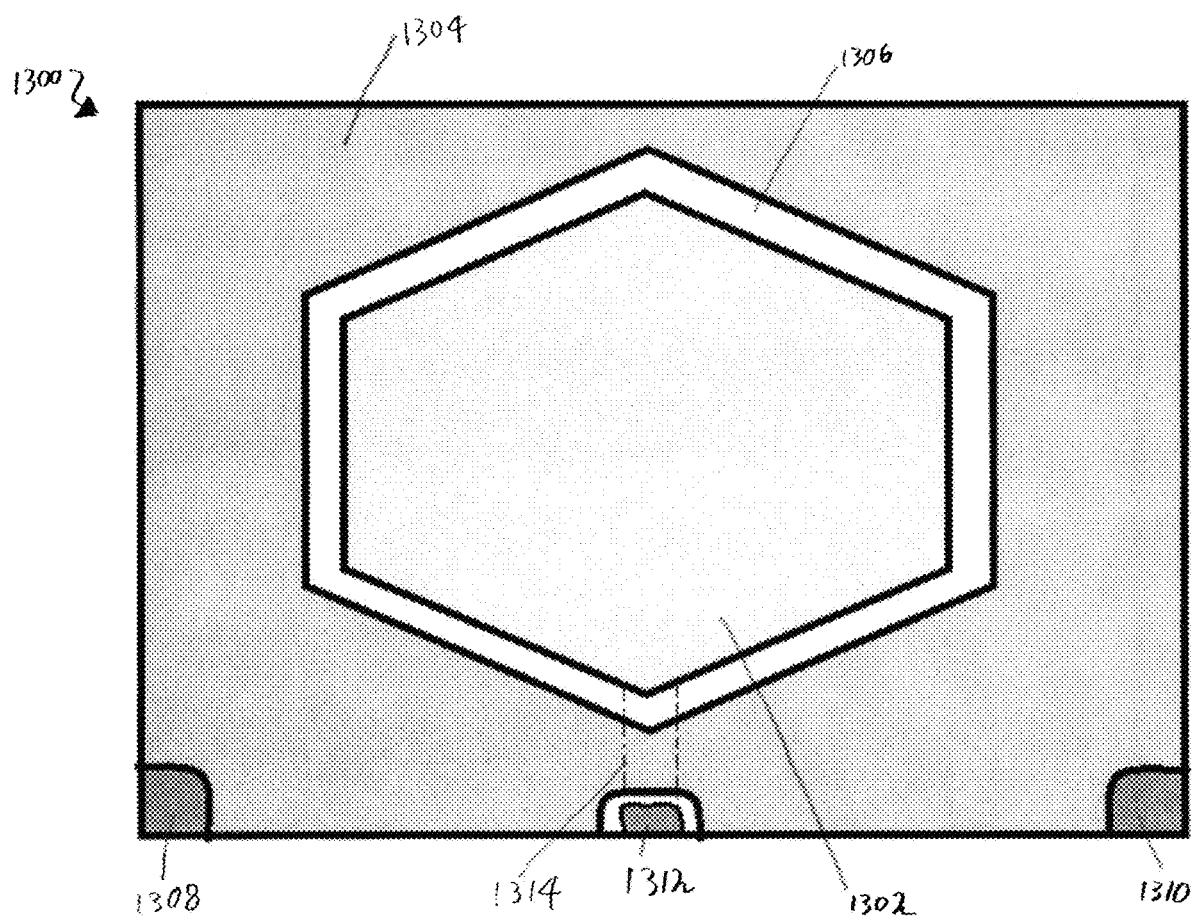
FIG. 14 is a top plan view of an embodiment of an LED chip incorporating features of the present invention.

Still another example variant active region shape is set forth in FIG. 14, which shows an LED chip 1300, comprising a first active region 1302 and a second active region 1304 separated by a separation region 1306. First and second cathode bond pads 1308, 1310 are configured to provide electrical contact to the second active region 1304 and a third cathode contact 1312, utilizes an internal connection 1314 to make electrical contact to the surrounded first active region 1302. As with FIG. 2 above, the anode contact is common to both active regions 1302, 1304 and is not shown. Unlike in FIG. 2, the first active region 1302 is hexagonal rather than square. The provides a wider beam emission pattern from the LED chip 1300 when the first active region 1302 is activated than that of the square first active region 102 of FIG. 2 discussed above.

Figure 15:
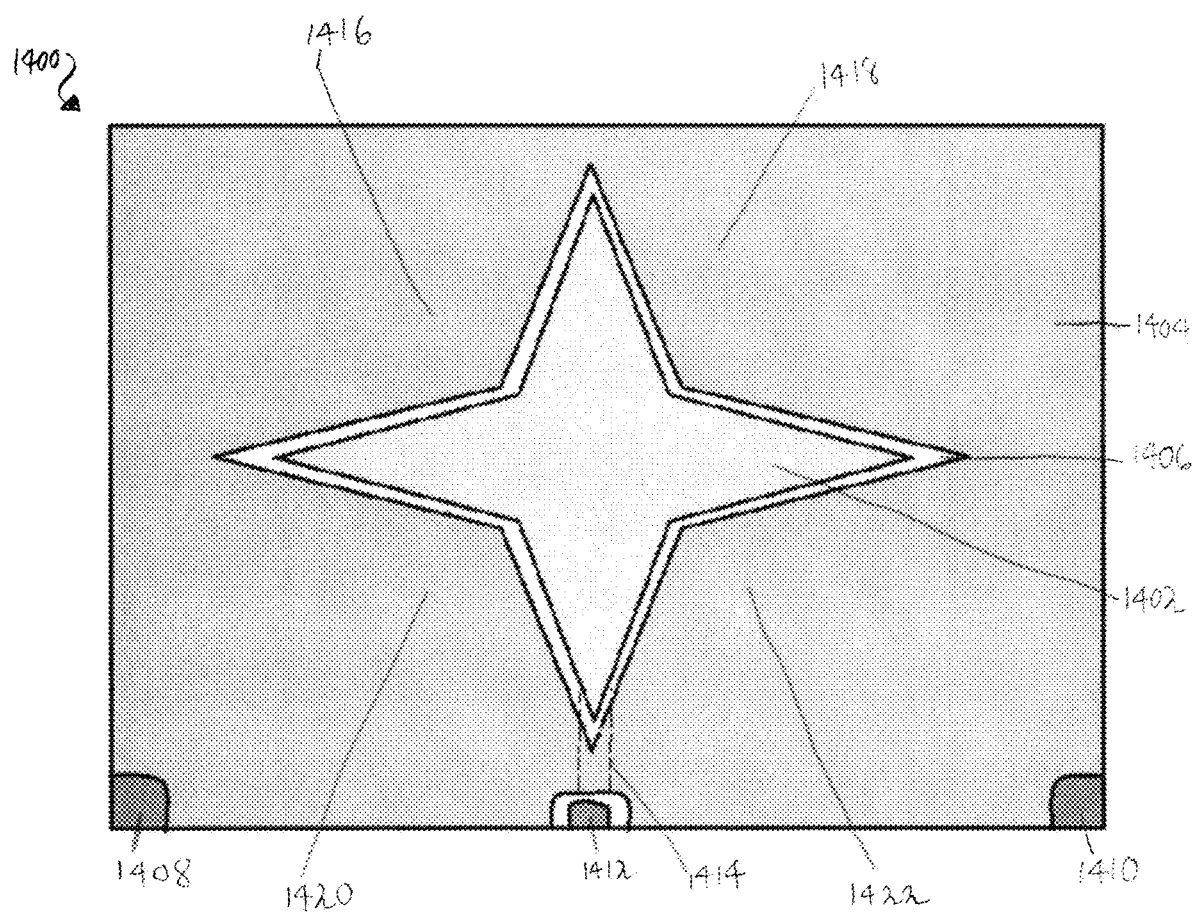
FIG. 15 is a top plan view of an embodiment of an LED chip incorporating features of the present invention.

Yet another example variant active region shape is set forth in FIG. 15, which shows an LED chip 1400, comprising a first active region 1402 and a second active region 1404 separated by a separation region 1406. First and second cathode bond pads 1408, 1410 are configured to provide electrical contact to the second active region 1404 and a third cathode contact 1412, utilizes an internal connection 1414 to make electrical contact to the surrounded first active region 1402. As with FIG. 2 above, the anode contact is common to both active regions 1402, 1404 and is not shown. Unlike in FIG. 2, the first active region 1402 is star-shaped rather than square. This provides a narrower beam emission pattern from the four corners 1416, 1418, 1420, 1422 of the LED chip 1400 when the first active region 1402 is activated than that of the square first active region 102 of FIG. 2 discussed above.

Figure 16:
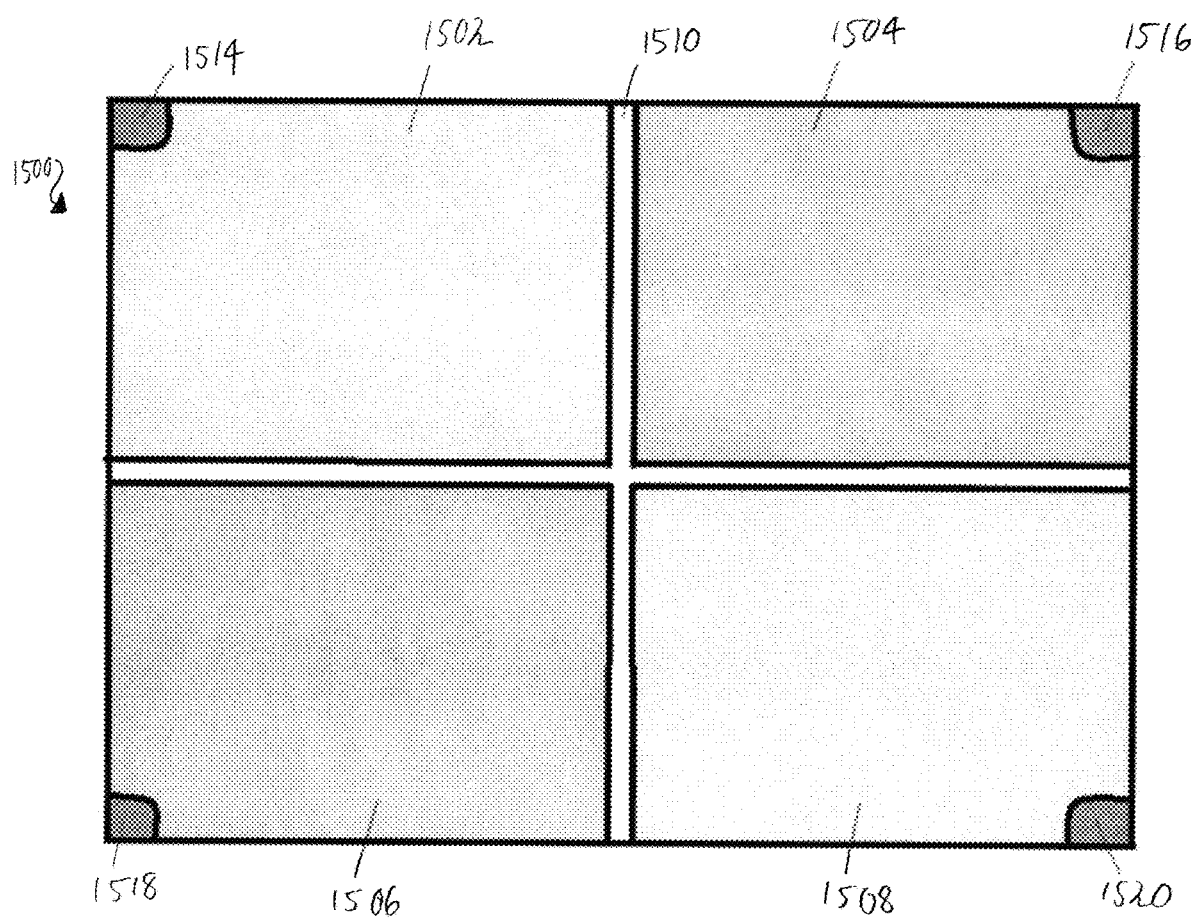
FIG. 16 is a top plan view of an embodiment of an LED chip incorporating features of the present invention.
Figure 17:
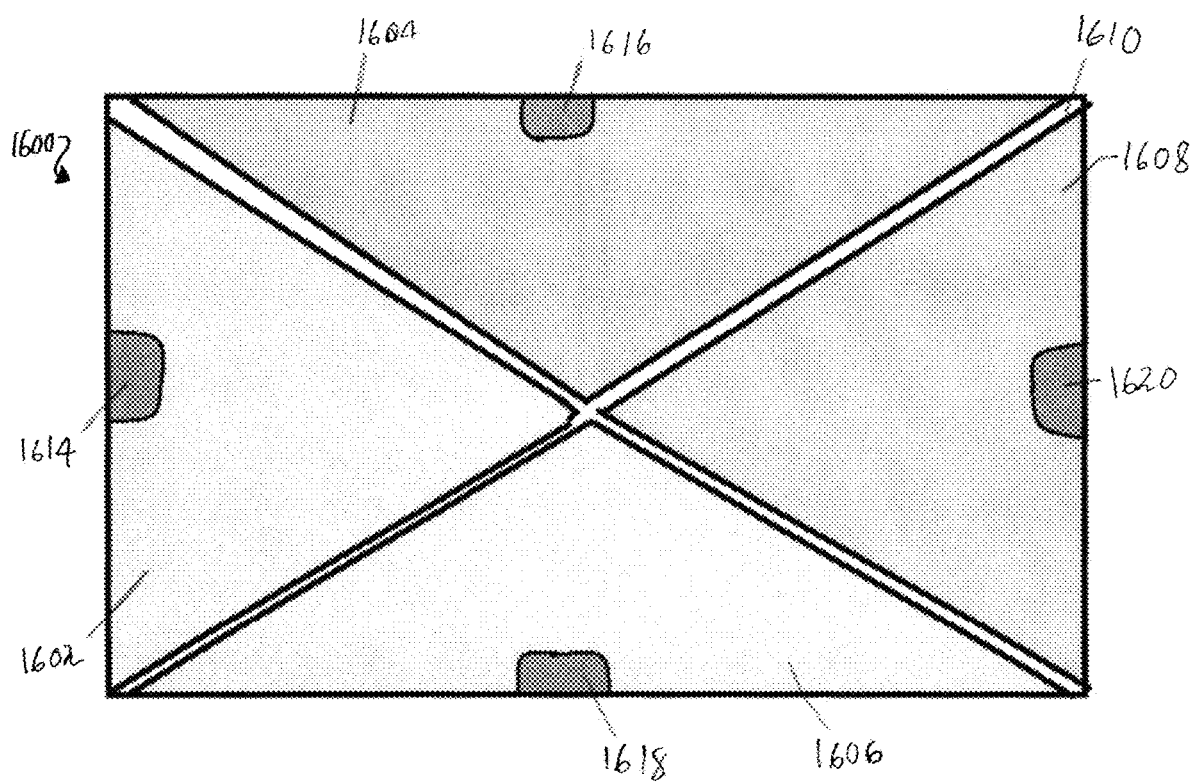
FIG. 17 is a top plan view of an embodiment of an LED chip incorporating features of the present invention.

Further configurations for multiple active regions on a LED chip are set forth in FIGS. 16 and 17, which show a plurality of active regions that are neither arranged in successive order, nor comprising an active region substantially surrounded by another active region. FIG. 16 shows an LED chip 1500 comprising four active regions 1502, 1504, 1506, 1508, divided into quadrants by a separation region 1510. Each active region 1502, 1504, 1506, 1508 comprises its own individual cathode contact 1514, 1516, 1518, 1520, with the anode contact being bonded to the underside of the LED chip 1500 and common to all active regions 1502, 1504, 1506, 1508 and not being shown. This configuration allows for individual control of beam emission of each of the four quadrants of the LED chip 1500.

Another alternate active region configuration is shown in FIG. 17, which shows an LED chip 1600, which is similar to LED chip 1500 in FIG. 16 above in that it comprises four active regions 1602, 1604, 1606, 1608, divided by a separation region 1610. Each active region 1602, 1604, 1606, 1608 comprises its own individual cathode contact 1614, 1616, 1618, 1620, with the anode contact being bonded to the underside of the LED chip 1600 and common to all active regions 1602, 1604, 1606, 1608 and not being shown. Unlike LED chip 1500 in FIG. 16 above, the four quadrants of LED chip 1600 are divided such that activation of both the first active region 1602 and the fourth active region 1608 can provide a wider lateral beam output and activation of both the second active region 1604 and the third active region 1606 can provide a wider vertical beam output.

Figure 18:
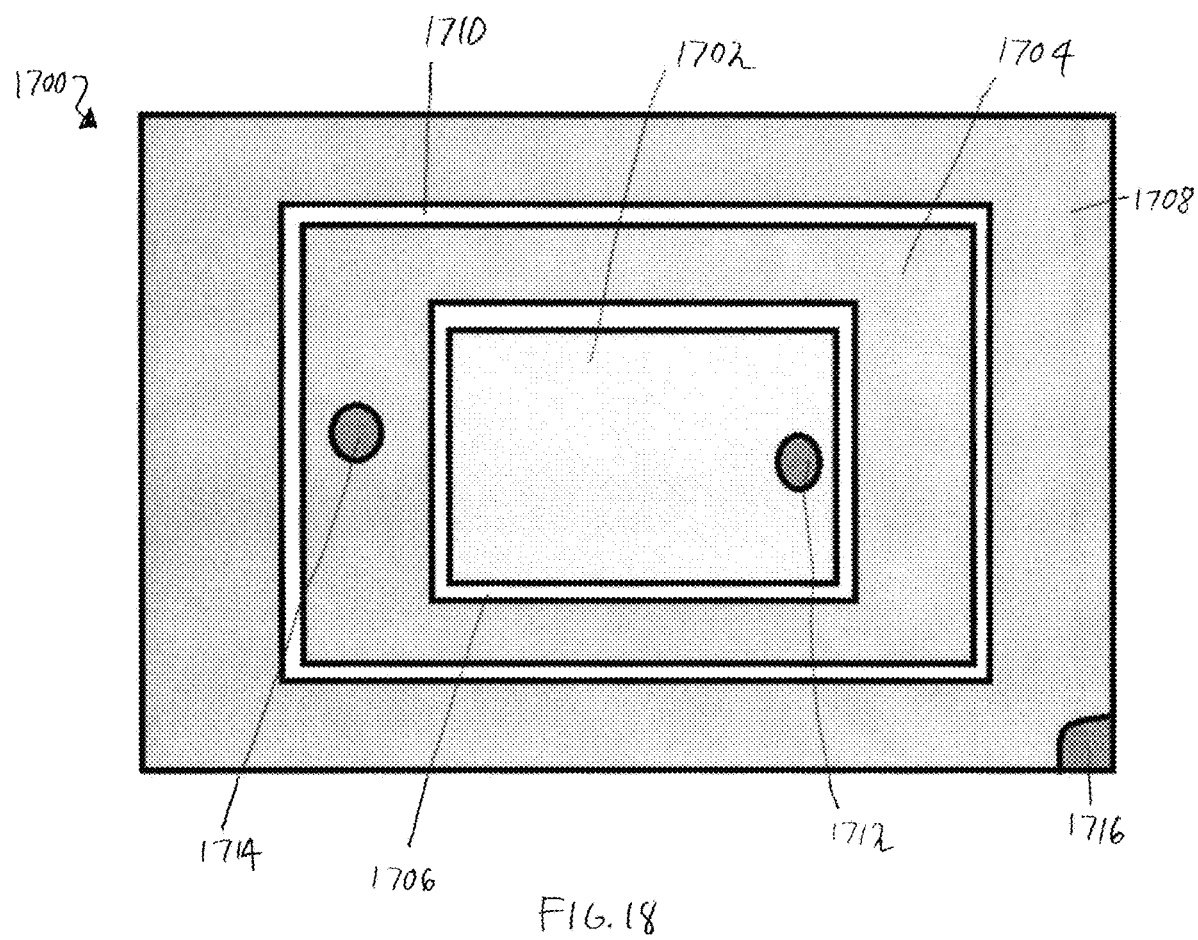
FIG. 18 is a top plan view of an embodiment of an LED chip incorporating features of the present invention.

Another example of multiple surrounding active regions, similar to that set forth in FIG. 3 above is set forth in FIG. 18, which shows an LED chip 1700 comprising a first active region 1702 surrounded by a second active region 1704 and separated from the second active region by a first separation region 1706. The second active region 1704 is surrounded by a third active region 1708 and separated from the second active region by a first separation region 1710. Each active region 1702, 1704, 1708 comprises its own individual cathode contact 1712, 1714, 1716, with the anode contact being bonded to the underside of the LED chip 1700 and common to all active regions 1702, 1704, 1708 and not being shown.

The LED chip 1700 in FIG. 18 differs from the LED chip 200 in FIG. 3 both in the shape of the active regions and in the fact that the first and second active regions 1702, 1704 in the LED chip 1700 of FIG. 18 comprise a shape that is different from one another—the first active region 1702 is square, whereas the second active region 1704 is rectangular. This allows the LED chip 1700 to have three different beam modes with further varying features. For example, activation of the first active region 1702 would provide a narrow beam output. Activation of the third active region 1708 would provide a wide beam output. Activation of the second rectangular-shaped active region 1704 would provide a beam output in between that of the first and third active regions 1702, 1708, but would also provide a wider lateral beam output due to its rectangular shape.

While being able to control and adjust beam output utilizing only selective electrical activation of desired active regions in an LED chip is advantageous alone, some particularly useful application for this technology include automatic lighting, such as in car headlights, where different beam modes are desired and flashlights where a simpler, fixed (non-movable) optic can be utilized and still achieve a variable beam pattern.

Figure 19:
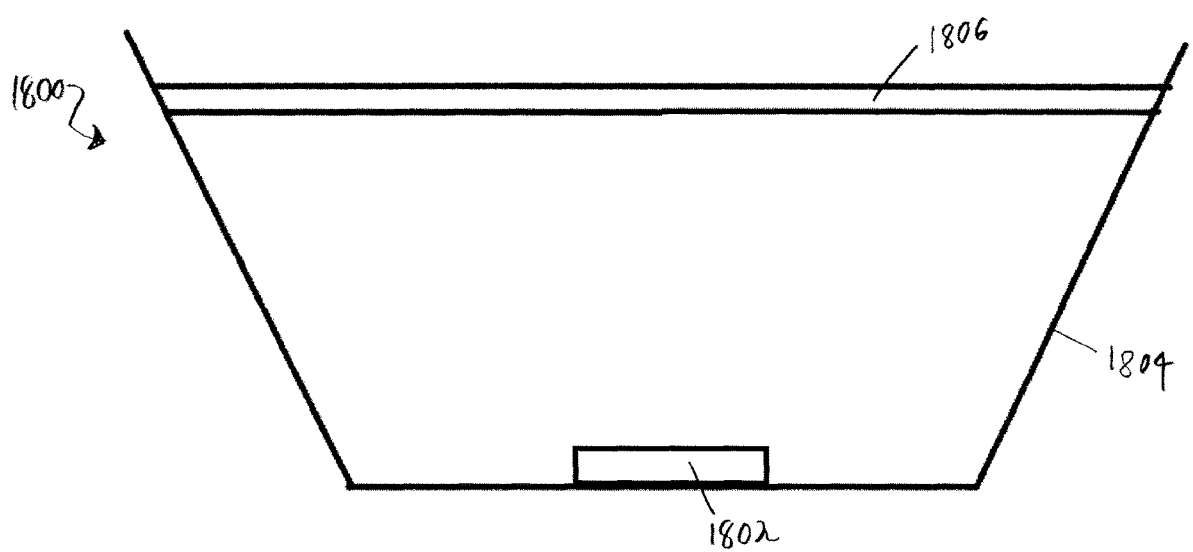
FIG. 19 is a front sectional view of an embodiment of a lighting device incorporating features of the present invention.

An example lighting device 1800 incorporating embodiments according to the present disclosure is shown in FIG. 19. The lighting device 1800 comprises a multiple active region LED 1802, for example, such as those disclosed in the embodiments of the present disclosure, which is configured with a reflector 1804 and/or an optic 1806. The reflector can be any reflector that is known in the art, for example a diffuse or specular reflector. In the embodiment shown, the reflector 1804 comprises a reflector-cup configuration with the LED 1802 configured inside the reflector 1804. The optic 1806 can be any optic known in the art, for example, a lens such as a diffusive lens. In some embodiments, the optic 1806 comprises a Total Internal Reflection (TIR) spot optic. An advantage of the lighting device 1800 is that since the multiple active regions in the LED 1802 are individually addressable, the reflector 1804 and the optic 1802 can be fixed (i.e. non-movable) and these structure's interactions with the variable beam output can further facilitate the creation of different specific beam patterns.

It is understood that while many of the embodiments specifically set forth herein are shown such that each active region in the plurality is individually addressable, it is possible to have configurations where multiple active regions are only addressable together in series. For example, an LED chip comprising four active regions can be configured, such that two of the regions are only addressable together while the other two are each individually addressable.

Although the present invention has been described in detail with reference to certain preferred configurations thereof, other versions are possible. Embodiments of the present invention can comprise any combination of compatible features shown in the various figures, and these embodiments should not be limited to those expressly illustrated and discussed. Therefore, the spirit and scope of the invention should not be limited to the versions described above.

The foregoing is intended to cover all modifications and alternative constructions falling within the spirit and scope of the invention as expressed in the appended claims, wherein no portion of the disclosure is intended, expressly or implicitly, to be dedicated to the public domain if not set forth in the claims.

We claim:

1. A light emitting diode (LED) chip, comprising:
a submount comprising an insulating material, the submount comprising a first surface, a second surface opposing the first surface, a first end, and a second end;
a plurality of active regions on or above the first surface of said submount and intermediately arranged between the first end and the second end;
metal connection elements in electrical contact with said plurality of active regions, wherein said metal connection elements are configured such that at least one active region of said plurality of active regions can receive an electrical signal independent from other active regions of said plurality of active regions, and at least one of said metal connection elements comprises an internal interconnect element including (i) a laterally-extending metal element buried within the insulating material of said submount in a direction substantially parallel to the plurality of active regions and surrounded from above and below by the insulating material, and (ii) first and second vertically-extending metal elements that contact the laterally-extending metal element and that are laterally spaced relative to one another, wherein a portion of the insulating material is arranged between the laterally-extending metal element and the plurality of active regions, and wherein at least portions of the first and second vertically-extending metal elements are laterally bounded by the insulating material;
one or more anode contacts arranged on the first surface proximate to the first end; and
one or more cathode contacts arranged on the first surface proximate to the second end;
wherein each active region of the plurality of active regions is arranged in successive order from the one or more anode contacts and the one or more cathode contacts;
wherein at least one of the following items (a) or (b) comprises multiple contacts: (a) the one or more anode contacts, and (b) the one or more cathode contacts;
wherein the LED chip is devoid of any anode contacts and any cathode contacts arranged on the first surface between different active regions of the plurality of active regions; and
wherein each active region of the plurality of active regions is coupled with a different pair of (i) the one or more anode contacts and (ii) the one or more cathode contacts, by the metal connection elements.

2. The LED chip of claim 1, wherein at least one active region of said plurality of active regions comprises a different shape from another active region of the plurality of active regions.

3. The LED chip of claim 1, wherein at least one of said metal connection elements comprises a bond pad in electrical contact with one active region of said plurality of active regions.

4. The LED chip of claim 1, wherein said metal connection elements comprise a plurality of cathode connection elements and a plurality of anode connection elements, and each active region of said plurality of active regions electrically contacts a different cathode connection element of the plurality of cathode connection elements and a different anode connection element of the plurality of anode connection elements.

5. The LED chip of claim 4, wherein each cathode connection element of the plurality of cathode connection elements comprises an integral interconnect element and each anode connection element of the plurality of anode connection elements comprises an integral interconnect element.

6. The LED chip of claim 1, wherein said one or more cathode contacts comprises a plurality of cathode bond pads in electrical contact with said plurality of active regions, and said one or more anode contacts comprises a plurality of anode bond pads in electrical contact with said plurality of active regions.

7. The LED chip of claim 1, wherein each active region of said plurality of active regions electrically contacts a separate cathode connection element and electrically contacts a common anode connection element.

8. The LED chip of claim 1, wherein each active region of said plurality of active regions electrically contacts a common cathode connection element and electrically contacts a separate anode connection element.

9. The LED chip of claim 1, wherein the insulating material comprises a unitary insulating material.

10. The LED chip of claim 1, further comprising at least one plurality of series-connected active regions that is addressable separately from active regions of the plurality of active regions.

11. A light emitting device comprising:
a light emitting diode (LED) chip comprising:
a submount comprising an insulating material, the submount comprising a first surface, a second surface opposing the first surface, a first end, and a second end;
a plurality of active regions on or above the first surface of said submount and intermediately arranged between the first end and the second end;
metal connection elements in electrical contact with said plurality of active regions, said metal connection elements being configured such that each active region of said plurality of active regions can receive an electrical signal independent from other active regions of said plurality of active regions;
a reflector cup containing said plurality of active regions;
one or more anode contacts arranged on the first surface proximate to the first end; and
one or more cathode contacts arranged on the first surface proximate to the second end;
wherein at least one metal connection element of said metal connection elements comprises an internal interconnect element including (i) a laterally-extending metal element buried within the insulating material of said submount in a direction substantially parallel to the plurality of active regions and surrounded from above and below by the insulating material, and (ii) first and second vertically-extending metal elements that contact the laterally-extending metal element and that are laterally spaced relative to one another, wherein a portion of the insulating material is arranged between the laterally-extending metal element and the plurality of active regions, and wherein at least portions of the first and second vertically-extending metal elements are laterally bounded by the insulating material;
wherein each active region of the plurality of active regions is arranged in successive order from the one or more anode contacts and the one or more cathode contacts;
wherein at least one of the following items (a) or (b) comprises multiple contacts: (a) the one or more anode contacts, and (b) the one or more cathode contacts;
wherein the LED chip is devoid of any anode contacts and any cathode contacts arranged on the first surface between different active regions of the plurality of active regions; and
wherein each active region of the plurality of active regions is coupled with a different pair of (i) the one or more anode contacts and (ii) the one or more cathode contacts, by the metal connection elements.

12. The light emitting device of claim 11, wherein each active region of said plurality of active regions electrically contacts a different cathode connection element and a different anode connection element.

13. The light emitting device of claim 11, further comprising an optic over said LED chip.

14. The light emitting device of claim 13, wherein said optic comprises a lens.

15. The light emitting device of claim 11, wherein the light emitting device is configured to adjust a pattern of an output beam by individually controlling each active region of the plurality of active regions.

16. The light emitting device of claim 11, wherein the insulating material comprises a unitary insulating material.

17. The light emitting device of claim 11, wherein the LED chip comprises at least one plurality of series-connected active regions that is addressable separately from active regions of the plurality of active regions.

* * * * *